United States Patent
Tseng et al.

(10) Patent No.: US 12,283,596 B2
(45) Date of Patent: Apr. 22, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Kuo-Pi Tseng, Hsinchu (TW); De-Fang Chen, Hsinchu (TW); Chao-Cheng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/348,531

(22) Filed: Jul. 7, 2023

(65) Prior Publication Data

US 2023/0361122 A1    Nov. 9, 2023

Related U.S. Application Data

(63) Continuation of application No. 17/230,295, filed on Apr. 14, 2021, now Pat. No. 11,742,353.

(51) Int. Cl.
*H01L 27/092* (2006.01)
*H01L 21/3065* (2006.01)
(Continued)

(52) U.S. Cl.
CPC ...... *H01L 27/0924* (2013.01); *H01L 21/3065* (2013.01); *H01L 21/823418* (2013.01);
(Continued)

(58) Field of Classification Search
CPC ............. H01L 27/0924; H01L 21/3065; H01L 21/823418; H01L 21/823431; H01L 29/66795; H01L 29/7851; H01L 29/267; H01L 29/7848; H01L 29/0653; H01L 29/0673; H01L 29/0847; H01L 29/165; H01L 29/66439; H01L 29/66545; H01L 29/78696; H01L 29/42392; H01L 29/775; H01L 21/823481; H01L 27/088; H01L 27/0886; H01L 21/823814; H01L 21/823821; B82Y 10/00
See application file for complete search history.

(56) References Cited

U.S. PATENT DOCUMENTS 9,209,247 B2    12/2015    Colinge et al.
9,236,267 B2    1/2016    De et al.
(Continued)

*Primary Examiner* — Karen Kusumakar
*Assistant Examiner* — Adam S Bowen
(74) *Attorney, Agent, or Firm* — Birch, Stewart, Kolasch & Birch, LLP

(57) ABSTRACT

A device includes a substrate, a channel layer, a gate structure, a first source/drain epitaxial structure, a second source/drain epitaxial structure, and a bottom dielectric structure. The channel layer is over the substrate. The gate structure is across the channel layer. The first source/drain epitaxial structure and the second source/drain epitaxial structure are on opposite sides of the channel layer and are connected to the channel layer. The bottom dielectric structure is between the first source/drain epitaxial structure and the substrate. A maximum width of the first source/drain epitaxial structure is greater than or equal to a maximum width of the bottom dielectric structure in a cross-sectional view.

20 Claims, 28 Drawing Sheets

(51) Int. Cl.
  *H01L 21/8234* (2006.01)
  *H01L 29/66* (2006.01)
  *H01L 29/78* (2006.01)

(52) U.S. Cl.
  CPC ............. *H01L 21/823431* (2013.01); *H01L 29/66795* (2013.01); *H01L 29/7851* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,325,820 B1 * | 6/2019 | Seo ................... H01L 29/1079 |
| 2019/0305085 A1 * | 10/2019 | Sung ................... H01L 29/36 |
| 2020/0052107 A1 | 2/2020 | Lie et al. |
| 2020/0279918 A1 | 9/2020 | Wu et al. |

\* cited by examiner

100

100a

SEMICONDUCTOR DEVICE AND MANUFACTURING METHOD THEREOF

PRIORITY CLAIM AND CROSS-REFERENCE

This application is a continuation application of U.S. patent application Ser. No. 17/230,295, filed Apr. 14, 2021, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
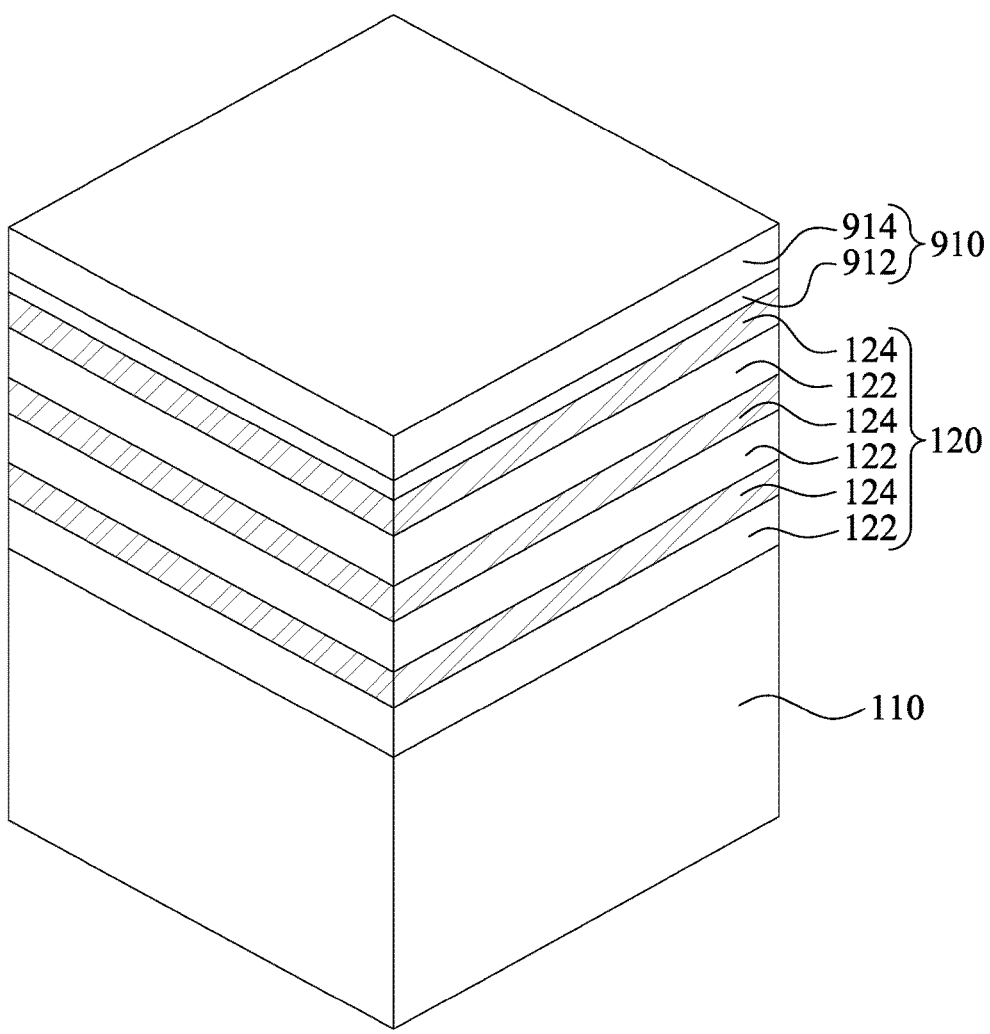
FIGS. 1-14 illustrate perspective views and cross-sectional views of intermediate stages in the formation of an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The nanostructure transistor (e.g., gate all around (GAA) transistor structures) may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit structures and methods of forming the same. More particularly, some embodiments of the present disclosure are related to GAA devices including a dielectric structure under a source/drain epitaxial structure. The dielectric structure is configured to improve the current leakage problem of the source/drain epitaxial structures.

FIGS. 1-14 illustrate perspective views and cross-sectional views of intermediate stages in the formation of an integrated circuit structure (or a semiconductor device) 100 in accordance with some embodiments of the present disclosure. In addition to the integrated circuit structure, FIGS. 1-4A, 5A, and 6A depict X-axis, Y-axis, and Z-axis directions. The formed transistors may include a p-type transistor (such as a p-type GAA FET) and/or an n-type transistor (such as an n-type GAA FET) in accordance with some exemplary embodiments. Throughout the various views and illustrative embodiments, like reference numbers are used to designate like elements. It is understood that additional operations can be provided before, during, and after the processes shown by FIGS. 1-14, and some of the operations described below can be replaced or eliminated, for additional embodiments of the method. The order of the operations/processes may be interchangeable.

FIGS. 1-4A, 5A, and 6A are perspective views of some embodiments of the integrated circuit structure 100 at intermediate stages during fabrication. FIGS. 4B, 5B, 6B-12A, and 13-14 are cross-sectional views of some embodiments of the integrated circuit structure 100 at intermediate stages during fabrication along a first cut (e.g., cut X-X in FIG. 4A), which is along a lengthwise direction of the channel and perpendicular to a top surface of the substrate. FIG. 12B is a cross-sectional view of some embodiments of the integrated circuit structure 100 at intermediate stages during fabrication along a second cut (e.g., cut Y-Y in FIG. 4A), which is in the gate region and perpendicular to the lengthwise direction of the channel.

Referring to FIG. 1, an epitaxial stack 120 is formed over the substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 120 includes epitaxial layers 122 of a first composition interposed by epitaxial layers 124 of a second composition. The first and second compositions can be different. In some embodiments, the epitaxial layers 122 are SiGe and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the epitaxial layers 124 to define a channel or channels of a device is further discussed below.

It is noted that three layers of the epitaxial layers 122 and three layers of the epitaxial layers 124 are alternately arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

As described in more detail below, the epitaxial layers 124 may serve as channel region(s) for a subsequently-formed semiconductor device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include the same material as the substrate 110. In some embodiments, the epitaxially grown layers 122 and 124 include a different material than the substrate 110. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Figure 2:
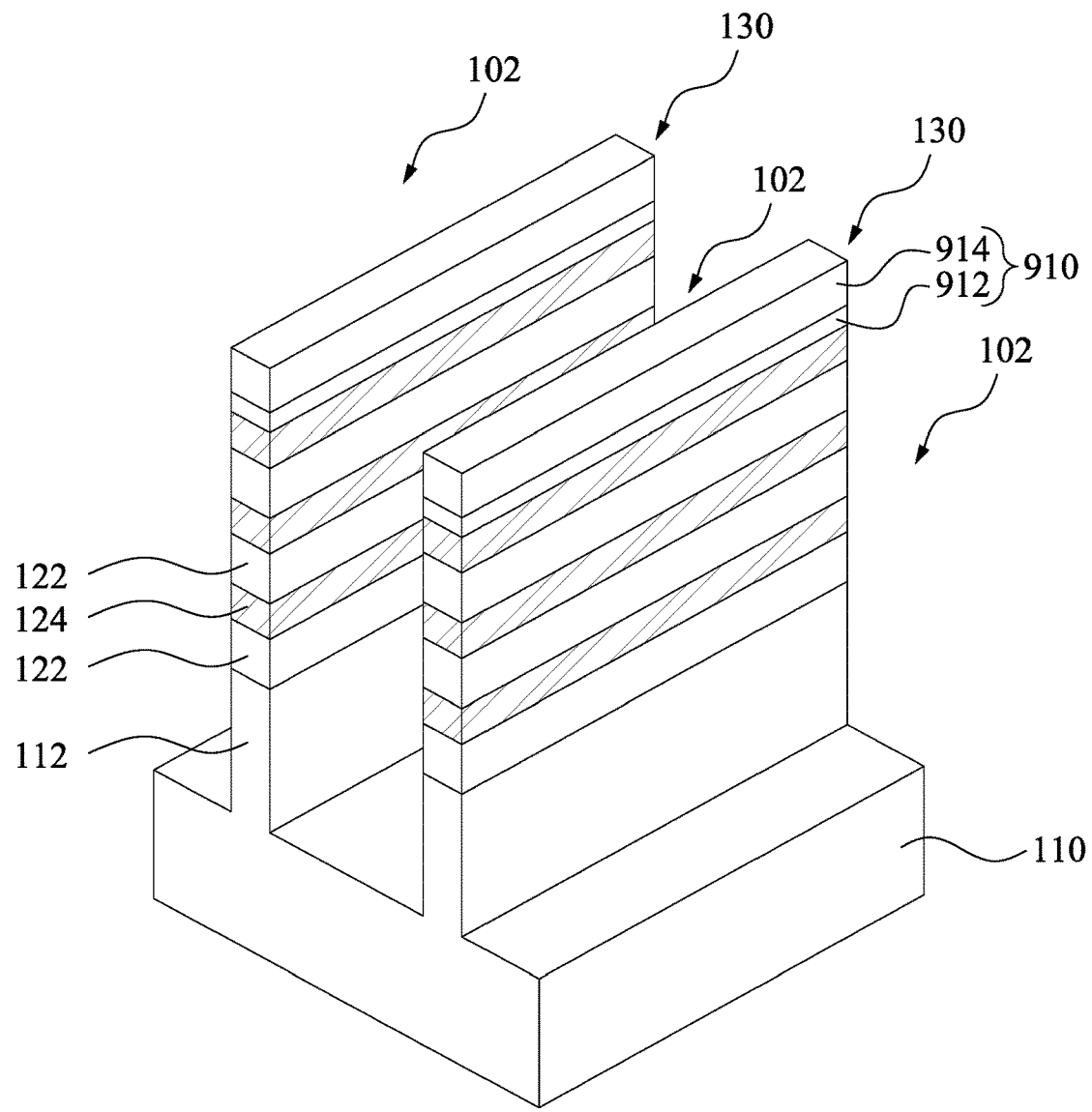

Referring to FIG. 2, a plurality of semiconductor fins 130 extending from the substrate 110 are formed. In various embodiments, each of the fins 130 includes a substrate portion 112 formed from the substrate 110 and portions of each of the epitaxial layers of the epitaxial stack including epitaxial layers 122 and 124. The fins 130 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 130 by etching initial epitaxial stack 120. The etching process can include dry etching, wet etching, reactive ion etching (RIE), and/or other suitable processes.

In the illustrated embodiment as illustrated in FIGS. 1 and 2, a hard mask (HM) layer 910 is formed over the epitaxial stack 120 prior to patterning the fins 130. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 120 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 130 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 110, and layers formed thereupon, while an etch process forms trenches 102 in unprotected regions through the HM layer 910, through the epitaxial stack 120, and into the substrate 110, thereby leaving the plurality of extending fins 130. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins 130.

Figure 3:
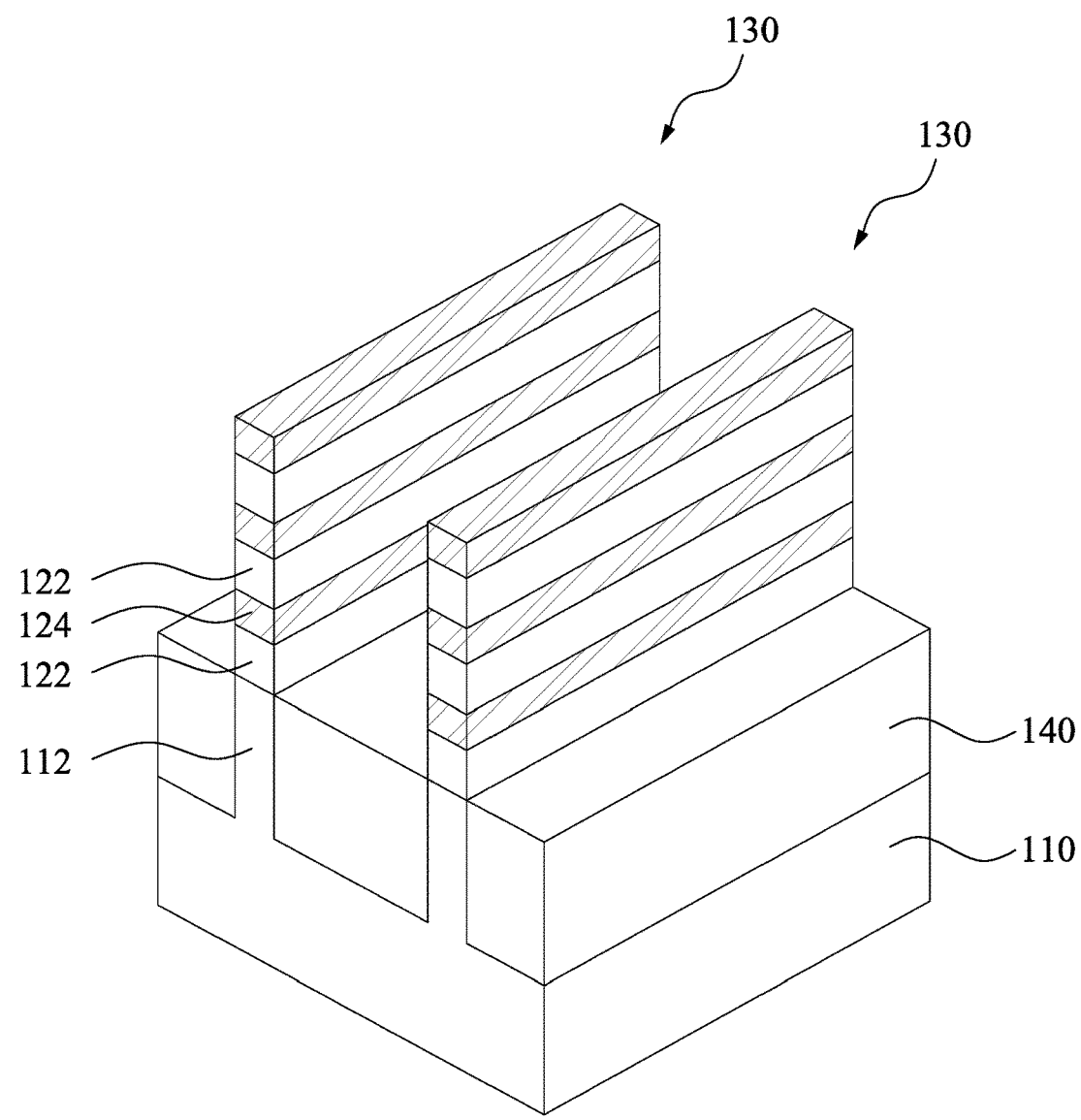

Next, as illustrated in FIG. 3, isolation regions 140 are formed interposing the fins 130. The isolation regions 140 may include a liner oxide (not shown). The liner oxide may be formed of a thermal oxide formed through a thermal oxidation of a surface layer of the substrate 110. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The isolation regions 140 may also include a dielectric material over the liner oxide, and the dielectric material may be formed using flowable chemical vapor deposition (FCVD), spin-on coating, or the like.

The isolation regions 140 are then recessed, so that the top portions of the epitaxial stack 120 protrude higher than the top surfaces of the neighboring isolation regions 140 to form protruding fins 130. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the isolation regions 140 is performed using a wet etch process. The etching chemical may include diluted HF, for example.

Figure 4A:
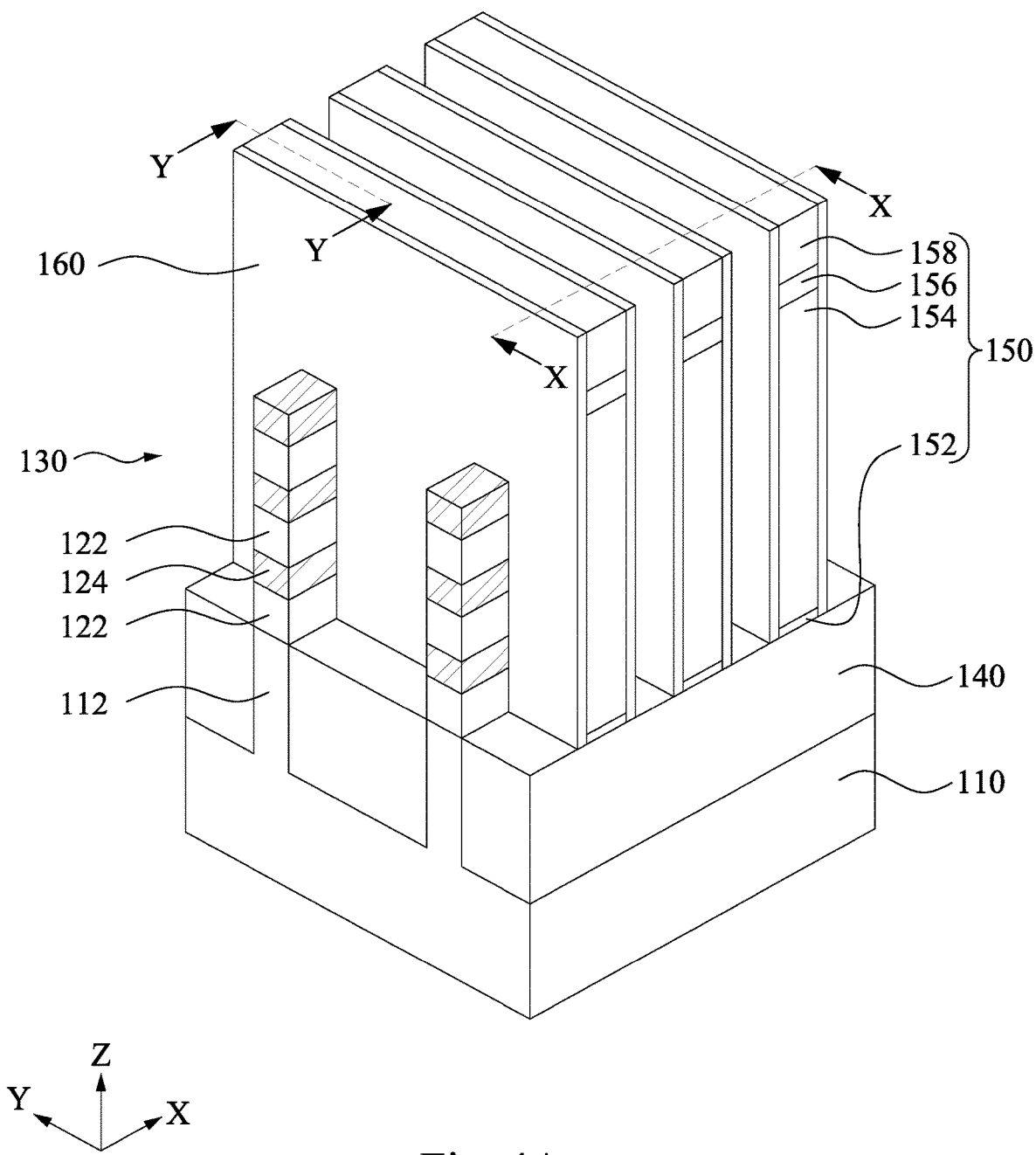
Figure 4B:
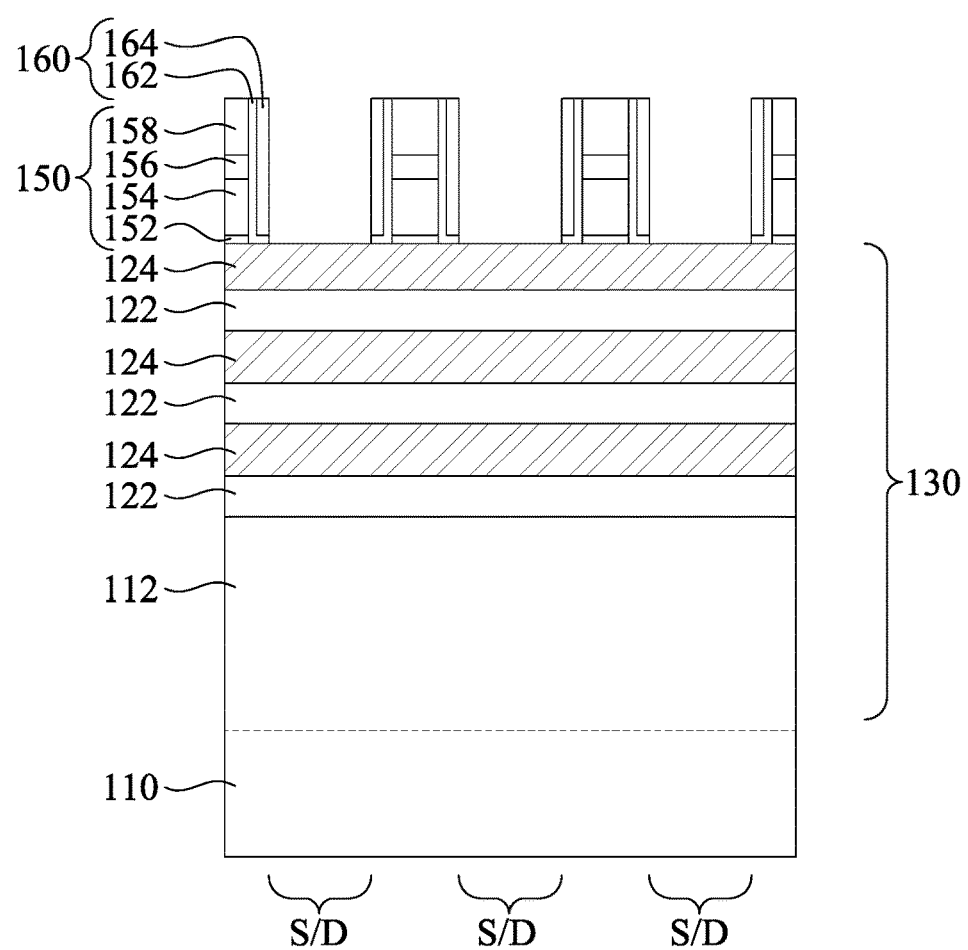

Reference is made to FIGS. 4A and 4B. Dummy gate structures 150 are formed over the substrate 110 and are at least partially disposed over the fins 130. The portions of the fins 130 underlying the dummy gate structures 150 may be referred to as the channel region. The dummy gate structures 150 may also define source/drain (S/D) regions of the fins 130, for example, the regions of the fins 130 adjacent and on opposing sides of the channel regions.

Dummy gate formation operation first forms a dummy gate dielectric layer 152 over the fins 130. Subsequently, a dummy gate electrode layer 154 and a hard mask which may include multiple layers 156 and 158 (e.g., an oxide layer 156 and a nitride layer 158) are formed over the dummy gate dielectric layer 152. The hard mask is then patterned, followed by patterning the dummy gate dielectric layer 152 by using the patterned hard mask as an etch mask. In some embodiments, after patterning the dummy gate electrode layer 154, the dummy gate dielectric layer 152 is removed from the S/D regions of the fins 130. The etch process may include a wet etch, a dry etch, and/or a combination thereof. The etch process is chosen to selectively etch the dummy gate dielectric layer 152 without substantially etching the fins 130, the dummy gate electrode layer 154, the oxide mask layer 156 and the nitride mask layer 158.

After formation of the dummy gate structures 150 is completed, gate spacers 160 are formed on sidewalls of the dummy gate structures 150. For example, a spacer material layer is deposited on the substrate 110. The spacer material layer may be a conformal layer that is subsequently etched back to form gate sidewall spacers. In the illustrated embodiment, a spacer material layer 160 is disposed conformally on top and sidewalls of the dummy gate structures 150. The spacer material layer 160 may include a dielectric material such as silicon oxide, silicon nitride, silicon carbide, silicon oxynitride, SiCN films, silicon oxycarbide, SiOCN films, and/or combinations thereof. In some embodiments, the spacer material layer 160 includes multiple layers, such as a first spacer layer 162 and a second spacer layer 164 (illustrated in FIG. 4B) formed over the first spacer layer 162. By way of example, the spacer material layer 160 may be formed by depositing a dielectric material over the dummy gate structures 150 using suitable deposition processes. An anisotropic etching process is then performed on the deposited spacer material layer 160 to expose portions of the fins 130 not covered by the dummy gate structure 150 (e.g., in source/drain regions of the fins 130). Portions of the spacer material layer directly above the dummy gate structure 150 may be completely removed by this anisotropic etching process. Portions of the spacer material layer on sidewalls of the dummy gate structure 150 may remain, forming gate sidewall spacers, which are denoted as the gate spacers 160, for the sake of simplicity. It is noted that although the gate spacers 160 are multi-layer structures in the cross-sectional view of FIG. 4B, they are illustrated as single-layer structures in the perspective view of FIG. 4A for the sake of simplicity.

Figure 5A:
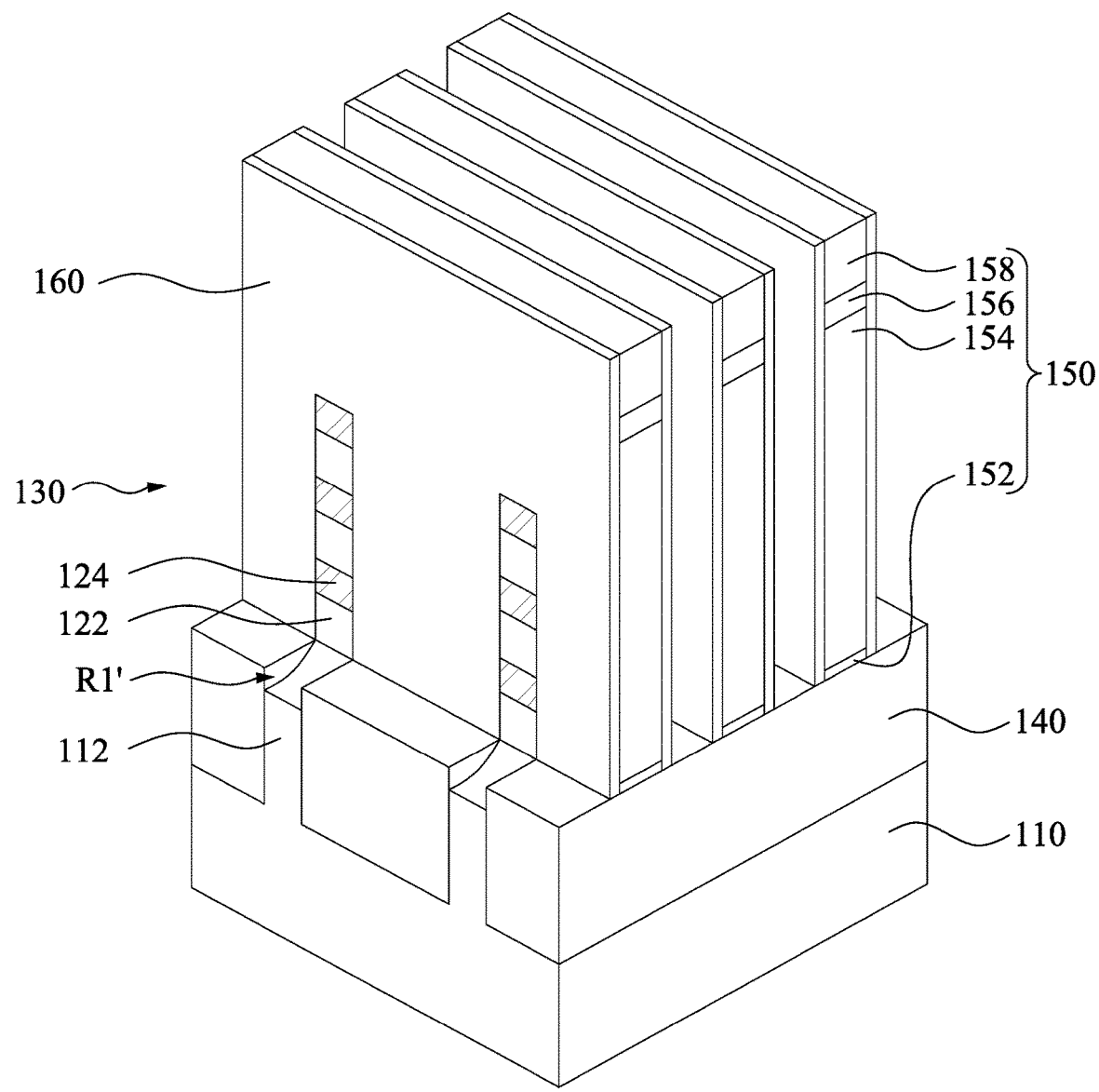
Figure 5B:
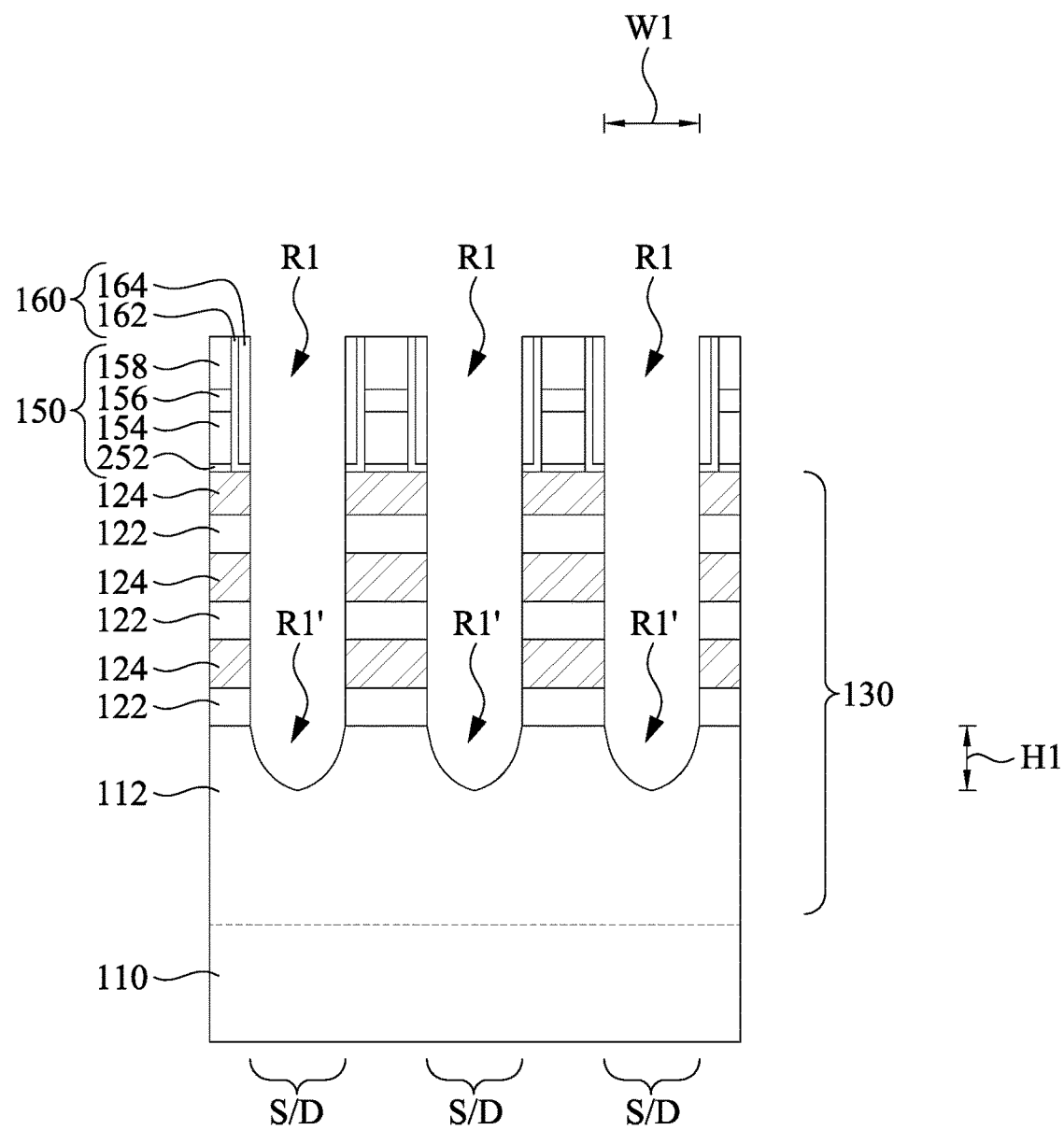

Next, as illustrated in FIGS. 5A and 5B, exposed portions of the semiconductor fins 130 that extend laterally beyond the gate spacers 160 (e.g., in source/drain regions S/D of the fins 130) are etched by using, for example, an anisotropic etching process that uses the dummy gate structure 150 and the gate spacers 160 as an etch mask, resulting in recesses R1 into the semiconductor fins 130 and between corresponding dummy gate structures 150. After the anisotropic etching, end surfaces of the epitaxial layers 122 and channel layers 124 and respective outermost sidewalls of the gate spacers 160 are substantially coterminous, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

The substrate portions 112 are also recessed to form recesses R1' in this anisotropic etching process. In some embodiments, the reaction gas for etching the substrate portions 112 is a gaseous mixture of HBr and He. In this anisotropic etching process, the gaseous mixture etches the substrate portions 112 at a vertical etch rate and a lateral etch rate slower than the vertical etch rate. With more HBr, the vertical etch rate increases; with more He, the lateral etch rate increases. As such, the shape of the recesses R1' can be adjusted by tuning the ratio of HBr to He. For example, HBr:He is in a range from about 1:1 to about 1:8 to obtain V-shaped recesses R1' in a cross-sectional view (see FIG. 5B). If HBr:He is greater than about 1:8, the recesses R1' have U-shapes in the cross-sectional view (i.e., the lateral etch rate increases). If HBr:He is less than about 1:1, the recesses R1' are not deep enough to accommodate bottom dielectric structures 174 (see FIG. 8).

In some other embodiments, the shape of the recesses R1' can be adjusted by tuning the pressure of the reaction gas. For example, the pressure of the reaction gas is in a range from about 3 mtorr to about 10 mtorr. If the pressure is greater than about 10 mtorr, the etching rate may be too slow; if the pressure is less than about 3 mtorr, the recesses R1' may have U-shapes in the cross-sectional view.

In some embodiments, each of the recesses R1' has a depth H1. For example, the depth H1 is in a range from about 1 nm to about 500 nm. If the depth H1 is greater than about 500 nm, source/drain epitaxial structures 180 (see FIG. 9A) may be not easy to be deposited on the bottom dielectric structures 174 (see FIG. 9A); if the depth H1 is less than about 1 nm, there is no space to accommodate the bottom dielectric structures 174, and the source/drain epitaxial structures 180 may have current leakage problems. In some embodiments, the recesses R1' has an aspect ratio (defined for recesses as the ratio of the recess depth H1/width W1) greater than about 1.3, e.g., in a range from about 1.3 to about 15. The recesses R1 are more like V-shapes in the cross-sectional view with high aspect ratio, and are more like U-shapes in the cross-sectional view with low aspect ratio.

Figure 6A:
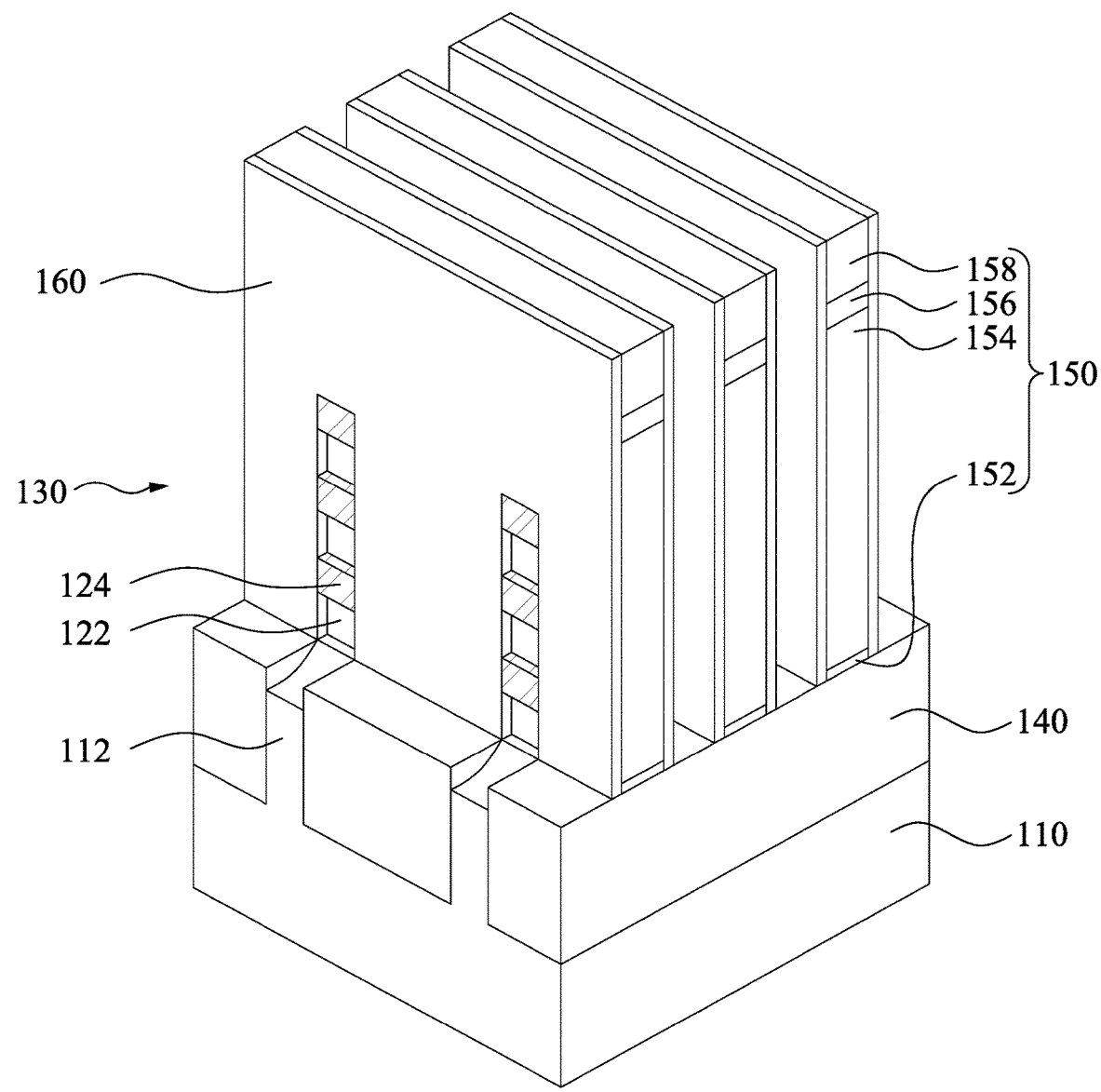
Figure 6B:
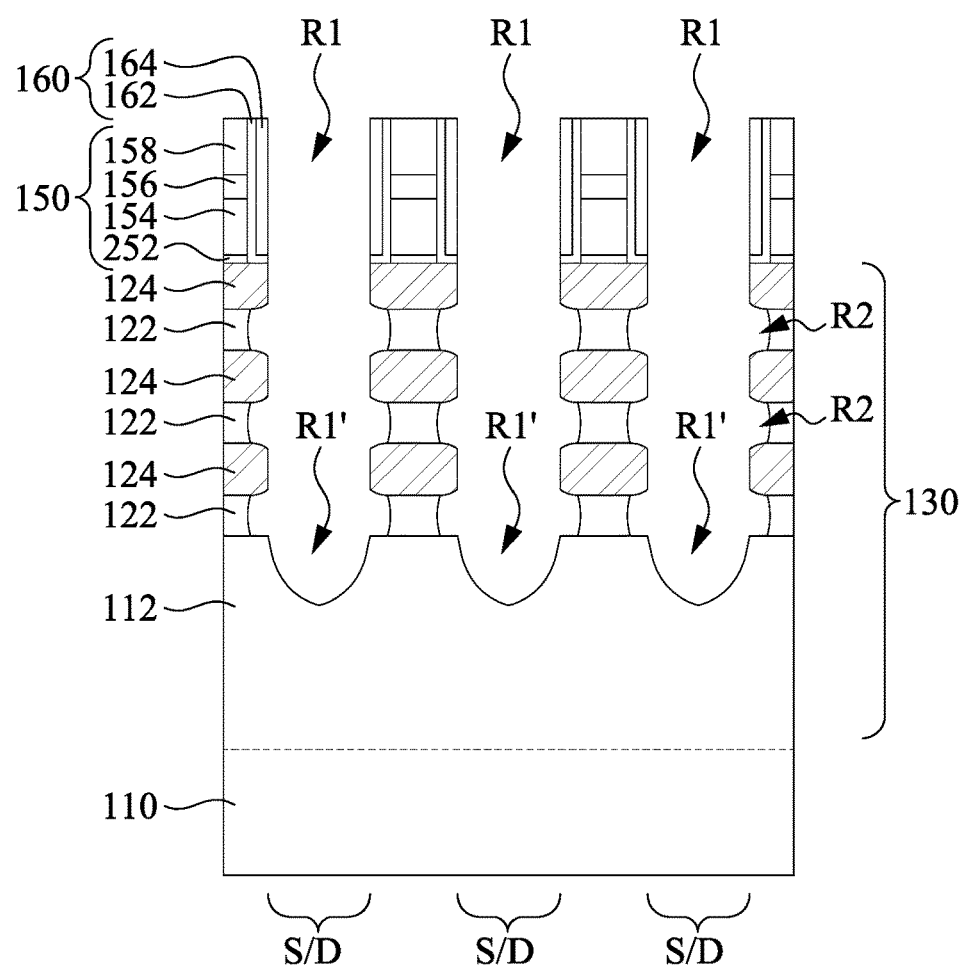

Next, in FIGS. 6A and 6B, the epitaxial layers 122 are laterally or horizontally recessed by using suitable etch techniques, resulting in lateral recesses R2 each vertically between corresponding channel layers 124. This operation may be performed by using a selective etching process. By way of example and not limitation, the epitaxial layers 122 are SiGe and the channel layers 124 are silicon allowing for the selective etching of the epitaxial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 is not significantly etched by the process of laterally recessing the epitaxial layers 122. As a result, the channel layers 124 laterally extend past opposite end surfaces of the epitaxial layers 122.

Figure 7:
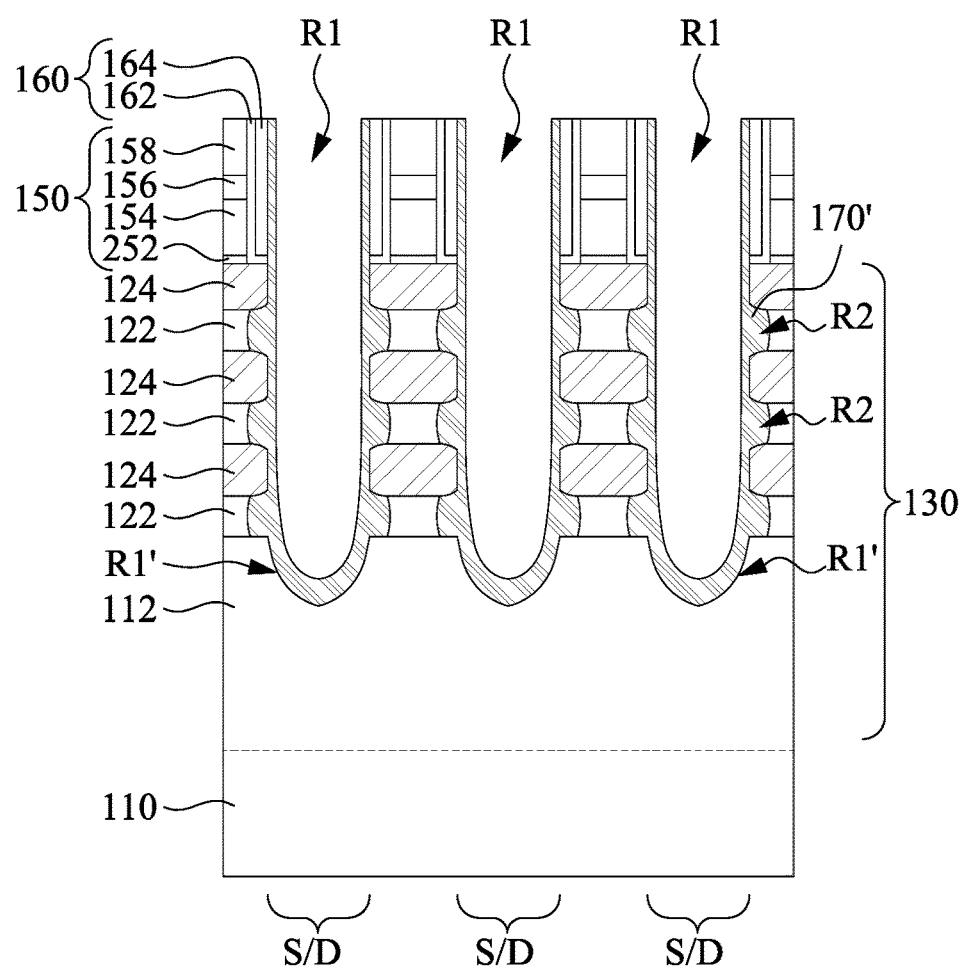

In FIG. 7, spacer material layers 170' are formed to fill the recesses R2 left by the lateral etching of the epitaxial layers 122 discussed above with reference to FIGS. 6A and 6B. Portions of the spacer material layers 170' are deposited in the recesses R1' as well. The spacer material layer 170' may be a low-k dielectric material, such as $SiO_2$, SiN, SiC, SiON, SiCN, or SiOCN, and may be formed by a suitable deposition method, such as ALD. In some embodiments, the inner dielectric spacer material layer 170' is intrinsic or un-doped with impurities. The spacer material layer 170' can be formed using CVD, including LPCVD and PECVD, PVD, ALD, or other suitable processes. In some embodiments, despite the spacer material layers 170' are conformally formed in the recesses R1', the spacer material layer 170' is easier to be merged in the V-shaped recess R1' than in a U-shaped recess. The merged spacer material layer 170' results in thick bottom dielectric structures 174 (see FIG. 8).

Figure 8:
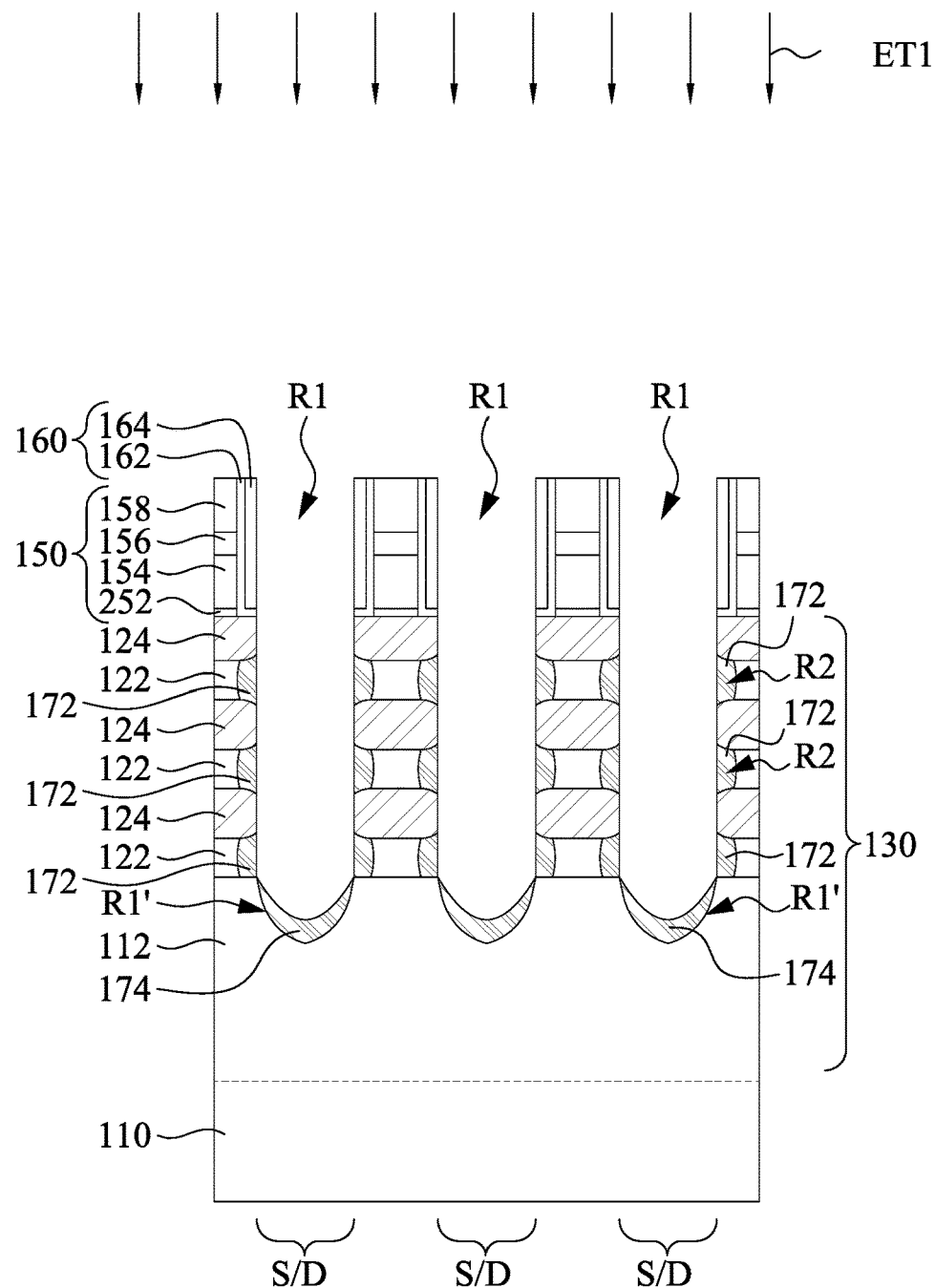

Referring to FIG. 8, after the deposition of the spacer material layer 170', an anisotropic etching process ET1 may be performed to trim the deposited spacer material layer 170', such that portions of the deposited spacer material layer 170' that fill the recesses R2 left by the lateral etching of the epitaxial layers 122 are left, and another portion of the deposited spacer material layers 170' that deposited in the bottom of the recesses R1' left by the etching of the fin structures 130 are left. After the trimming process, the remaining portions of the deposited spacer material are denoted as inner dielectric spacers 172 in the recesses R2 and bottom dielectric structures 174 in the recesses R1', for the sake of simplicity. The inner dielectric spacers 172 serve to isolate metal gates from source/drain epitaxial structures formed in subsequent processing, and the bottom dielectric structures 174 serve to isolate source/drain epitaxial structures from the substrate 110. In the example of FIG. 8, sidewalls of the inner dielectric spacers 172 are substantially aligned with sidewalls of the channel layers 124.

In some embodiments, the anisotropic etching process ET1 is a plasma etching. The substrate 110 having the structure illustrated in FIG. 7 can be loaded into a plasma tool and exposed to a plasma environment generated by RF or microwave power in a gaseous mixture of a fluorine containing gas, such as $CHF_3$, $CF_4$, $C_4F_8$, $C_5F_8$, $C_4F_6$, or similar species, an inert gas, such as argon or helium, for a duration time sufficient to etch portions of the spacer material layer 170' outside the recesses R1' and R2. A plasma generated in a gaseous mixture including $CHF_3$, $CF_4$ and argon can be used to tune the shape of the bottom dielectric structures 174. With more fluorine, the lateral etching rate of the plasma etching is increased, and more amount of the bottom dielectric structures 174 remains. The plasma is generated by RF power with a bias greater than 0 and equal to or less than about 30 V. If the bias is greater than about 30V, the bottom dielectric structures 174 may be completely removed; if the bias is absent, the inner dielectric spacers 172 may be over-etched.

Figure 9A:
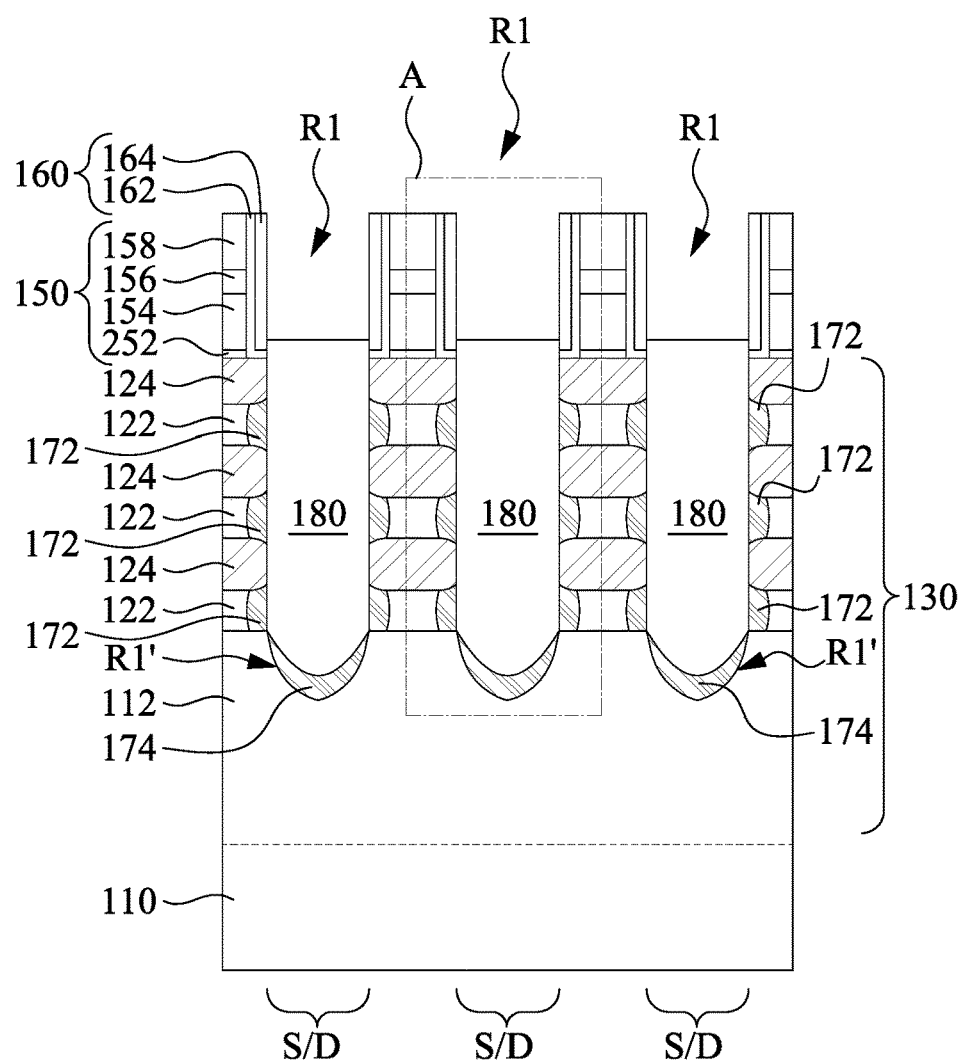

In FIG. 9A, source/drain epitaxial structures 180 are formed over the source/drain regions S/D of the semiconductor fins 130. The source/drain epitaxial structures 180 may be formed by performing an epitaxial growth process that provides an epitaxial material on the fins 130. During the epitaxial growth process, the dummy gate structures 150, gate sidewall spacers 160, the inner dielectric spacers 172, and the bottom dielectric structures 174 limit the source/drain epitaxial structures 180 to the source/drain regions S/D. In some embodiments, the lattice constants of the epitaxy structures 180 are different from the lattice constant of the epitaxial layers 124, so that the epitaxial layers 124 can be strained or stressed by the epitaxy structures 180 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the epitaxial layers 124.

In some embodiments, the source/drain epitaxial structures 180 may include Ge, Si, GaAs, AlGaAs, SiGe, GaAsP, SiP, or other suitable material. The source/drain epitaxial structures 180 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 180 are not in-situ doped, an implantation process (i.e., a junction implant process) is performed to dope the source/drain epitaxial structures 180. In some exemplary embodiments, the source/drain epitaxial structures 180 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the bottom dielectric structures 174 in the p-type device regions. The mask may then be removed. Subsequently, a mask, such as a photoresist, may be formed over the p-type device region while exposing the n-type device regions, and n-type epitaxial structures may be formed on the bottom dielectric structures 174 in the n-type device region. The mask may then be removed.

Once the source/drain epitaxial structures 180 are formed, an annealing process can be performed to activate the p-type dopants or n-type dopants in the source/drain epitaxial structures 180. The annealing process may be, for example, a rapid thermal anneal (RTA), a laser anneal, a millisecond thermal annealing (MSA) process or the like.

Figure 9B:
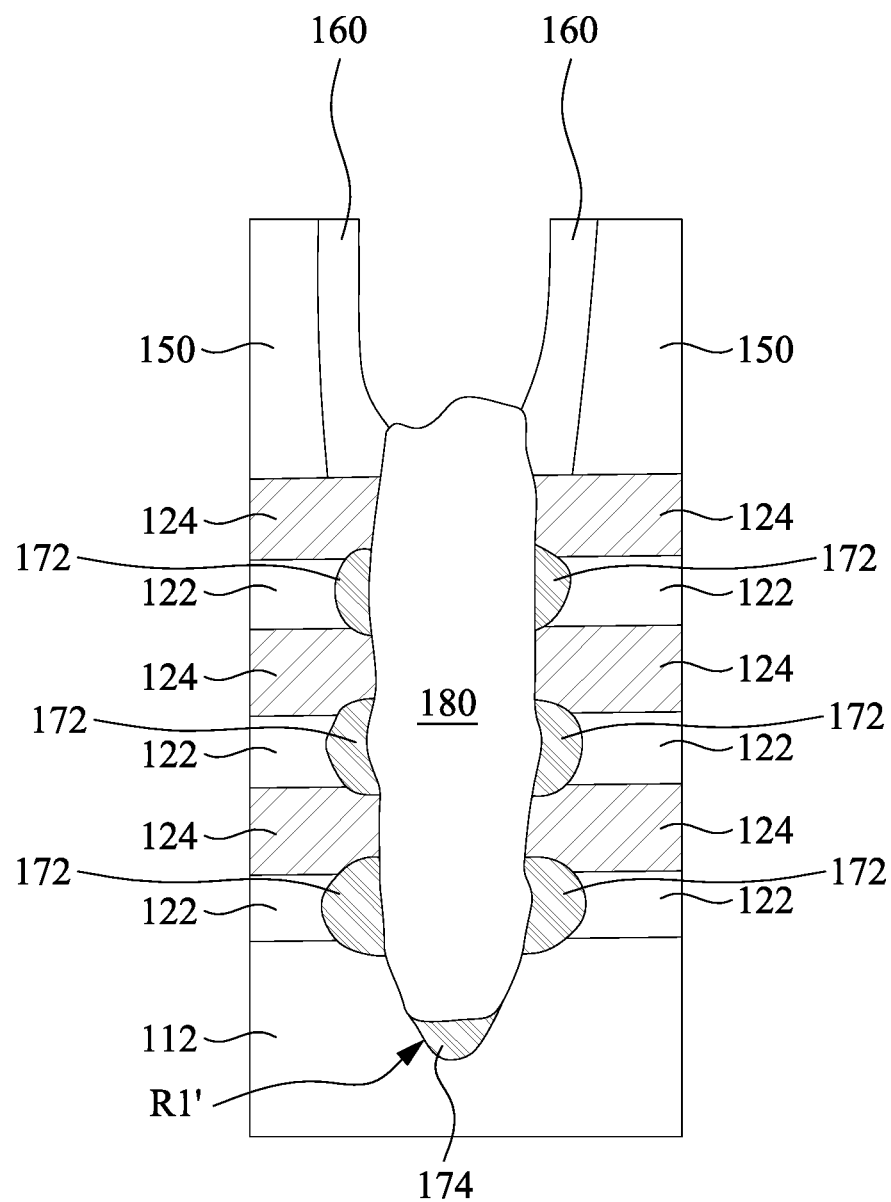
Figure 9C:
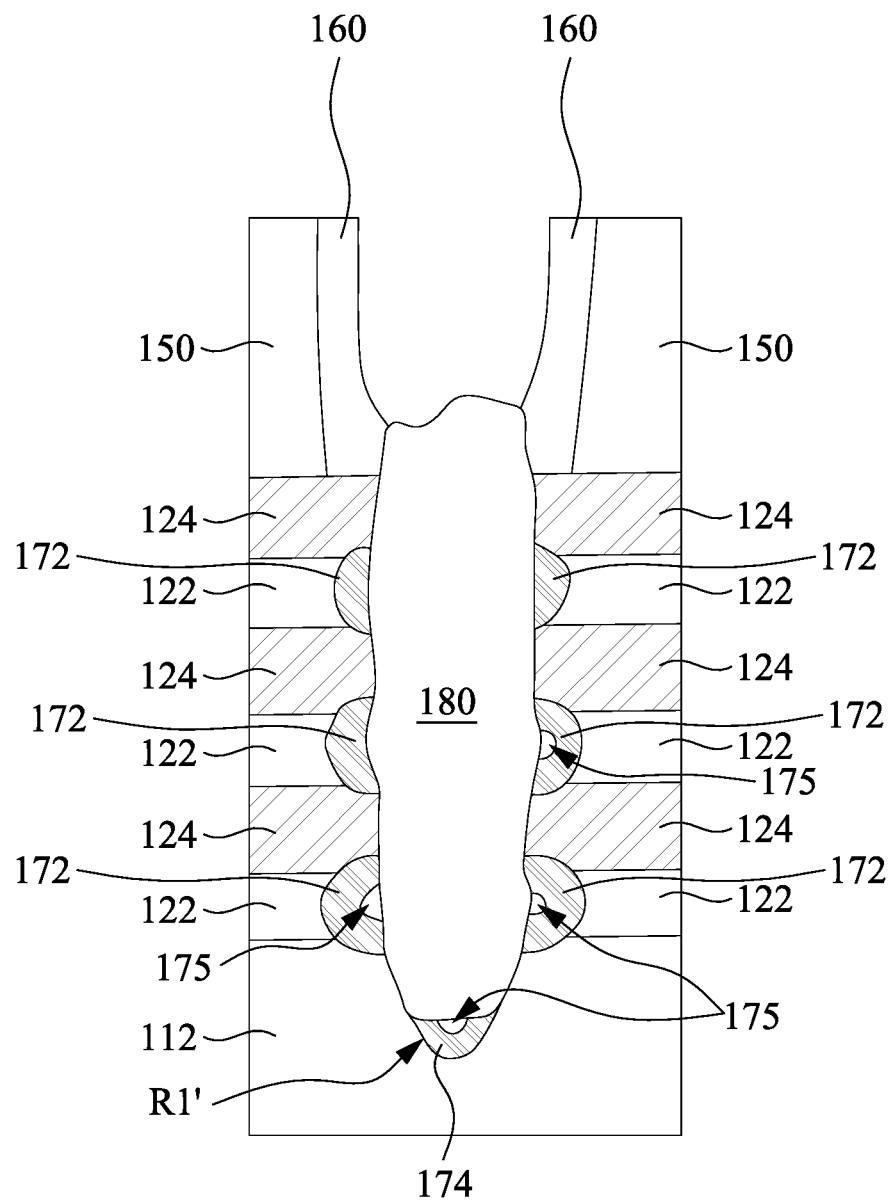

FIGS. 9B and 9C are enlarged views of area A in FIG. 9A according to some embodiments. In FIG. 9B, the lower the inner dielectric spacers 172, the larger size of the inner dielectric spacers 172. In some embodiments, the size of the inner dielectric spacers 172 is determined by the size of the recesses R2 (see FIG. 6B), which can be tuned during the lateral recessing process shown in FIG. 6B. Further, the bottom dielectric structures 174 expose portions of the inner surfaces of the recesses R1'. With such configuration, the source/drain epitaxy structures 180 may fill the rest of the recesses R1'. That is, the source/drain epitaxy structures 180 are in contact with the substrate 110; be that as it may, the bottom dielectric structures 174 in FIG. 9B also improve the current leakage problem of the source/drain epitaxy structures 180. In FIG. 9C, at least one of the inner dielectric spacers 172 and/or the bottom dielectric structure 174 has a void 175 therein. The void 175 is defined by the inner dielectric spacer 172 and the source/drain epitaxy structures 180 or by the bottom dielectric structure 174 and the source/drain epitaxy structures 180. Since the spacer material layers 170' (see FIG. 7) is conformally formed in the recesses R1' and R2, the spacer material layers 170' may not fill the recesses R1' and/or R2 if the spacer material layers 170' are thin. As such, after the anisotropic etching process ET1 in FIG. 8, void(s) 175 may be formed in the inner dielectric spacers 172 and/or the bottom dielectric structure 174.

Figure 10:
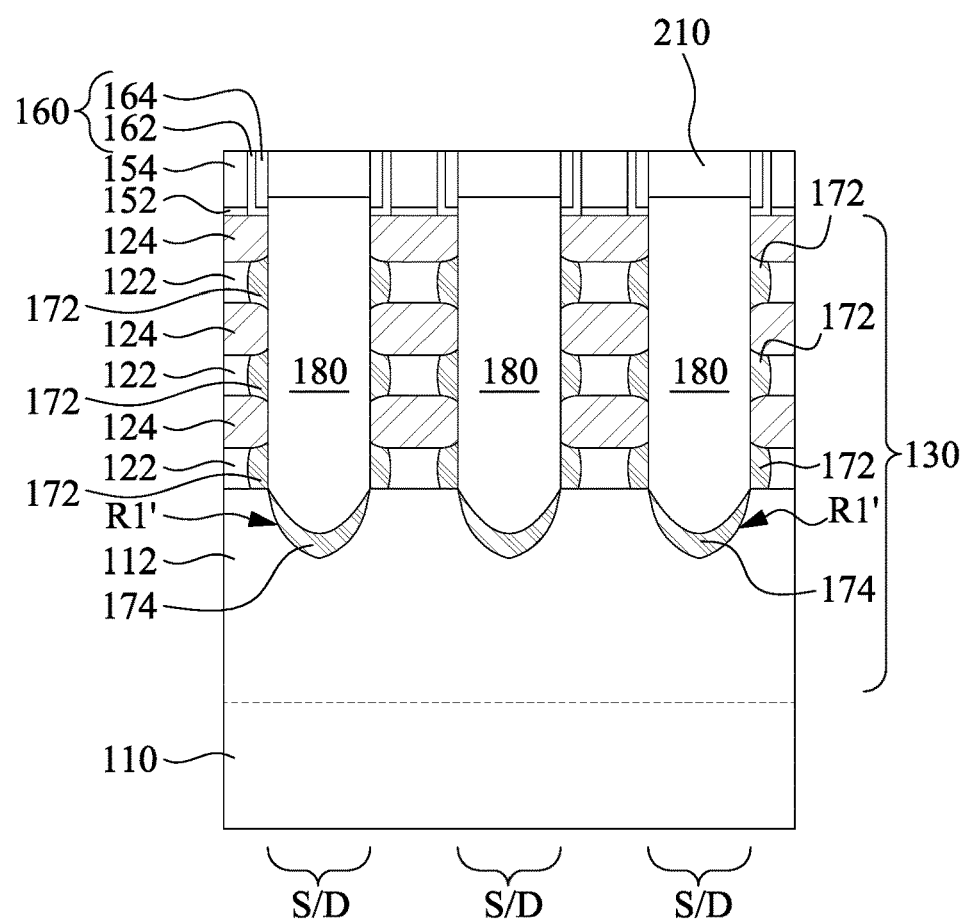
Figure 11:
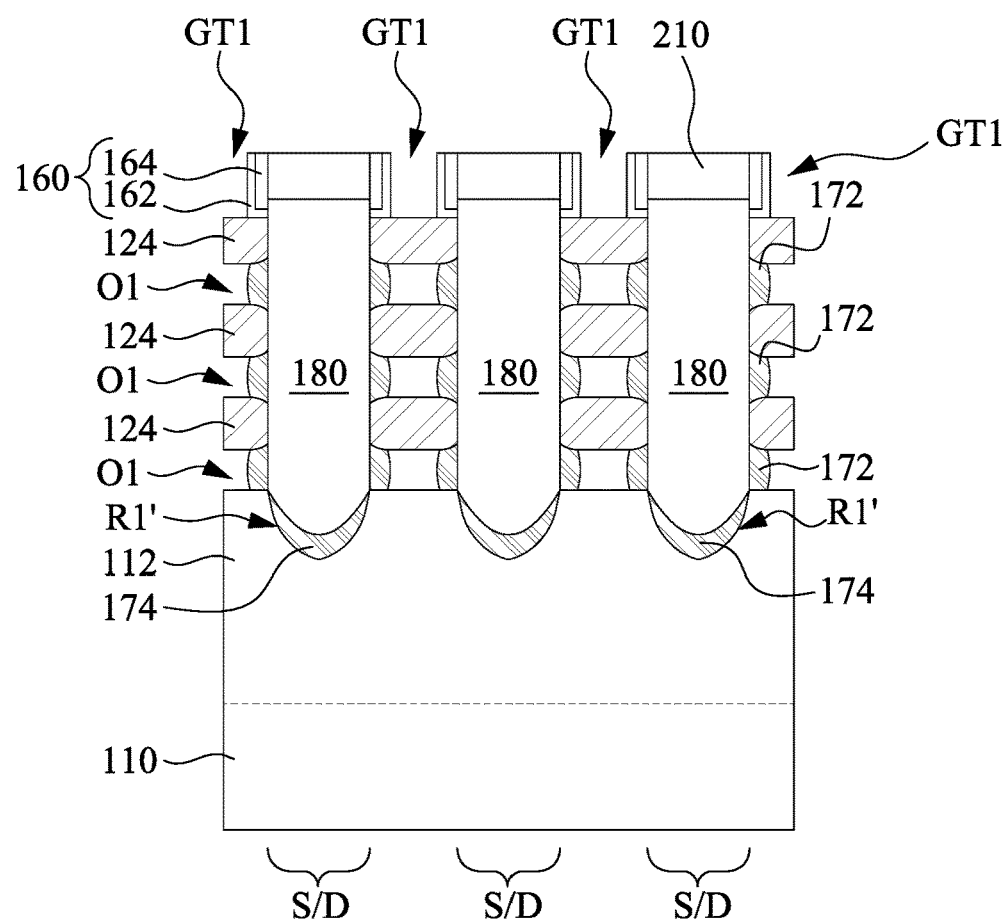

In FIG. 10, an interlayer dielectric (ILD) layer 210 is formed on the substrate 110. In some embodiments, a contact etch stop layer (CESL) is also formed prior to forming the ILD layer 210. In some examples, the CESL includes a silicon nitride layer, silicon oxide layer, a silicon oxynitride layer, and/or other suitable materials having a different etch selectivity than the ILD layer 210. The CESL may be formed by plasma-enhanced chemical vapor deposition (PECVD) process and/or other suitable deposition or oxidation processes. In some embodiments, the ILD layer 210 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer 210 may be deposited by a PECVD process or other suitable deposition technique. In some embodiments, after formation of the ILD layer 210, the wafer may be subject to a high thermal budget process to anneal the ILD layer 210.

In some examples, after depositing the ILD layer 210, a planarization process may be performed to remove excessive materials of the ILD layer 210. For example, a planarization process includes a chemical mechanical planarization (CMP) process which removes portions of the ILD layer 210 (and CESL layer, if present) overlying the dummy gate structures 150 and planarizes a top surface of the integrated circuit structure 100. In some embodiments, the CMP process also removes hard mask layers 156 and 158 (as shown in FIG. 9A) and exposes the dummy gate electrode layer 154.

Thereafter, the dummy gate structures 150 (as shown in FIG. 9A) are removed first, and then the epitaxial layers (i.e., sacrificial layers) 122 (as shown in FIG. 10) are removed. The resulting structure is illustrated in FIG. 11. In some embodiments, the dummy gate structures 150 are removed by using a selective etching process (e.g., selective dry etching, selective wet etching, or a combination thereof) that etches the materials in dummy gate structures 150 at a faster etch rate than it etches other materials (e.g., gate sidewall spacers 160 and/or ILD layer 210), thus resulting in gate trenches GT1 between corresponding gate sidewall spacers 160, with the epitaxial layers 122 exposed in the gate trenches GT1. Subsequently, the epitaxial layers 122 in the gate trenches GT1 are removed by using another selective etching process that etches the epitaxial layers 122 at a faster etch rate than it etches the channel layers 124, thus forming openings O1 between neighboring epitaxial layers (i.e., channel layers) 124. In this way, the epitaxial layers 124 become nanosheets suspended over the substrate 110 and between the source/drain epitaxial structures 180. This operation is also called a channel release process. At this interim processing operation, the openings O1 between the epitaxial layers (i.e., nanosheets) 124 may be filled with ambient environment conditions (e.g., air, nitrogen, etc). In some embodiments, the epitaxial layers 124 can be interchangeably referred to as nanostructure (nanowires, nanoslabs and nanorings, nanosheet, etc., depending on their geometry). For example, in some other embodiments the epitaxial layers 124 may be trimmed to have a substantial rounded shape (i.e., cylindrical) due to the selective etching process for completely removing the epitaxial layers 122. In that case, the resultant epitaxial layers 124 can be called nanowires.

In some embodiments, the epitaxial layers 122 are removed by using a selective wet etching process. In some embodiments, the epitaxial layers 122 are SiGe and the epitaxial layers 124 are silicon allowing for the selective removal of the epitaxial layers 122. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 may not be significantly etched by the channel release process. It can be noted that both the channel release operation and the previous operation of laterally recessing sacrificial layers (the operation as shown in FIGS. 6A and 6B) use a selective etching process that etches SiGe at a faster etch rate than etching Si, and therefore these two operations may use the same etchant chemistry in some embodiments. In this case, the etching time/duration of channel release operation is longer than the etching time/duration of the previous operation of laterally recessing sacrificial layers, so as to completely remove the sacrificial SiGe layers.

Figure 12A:
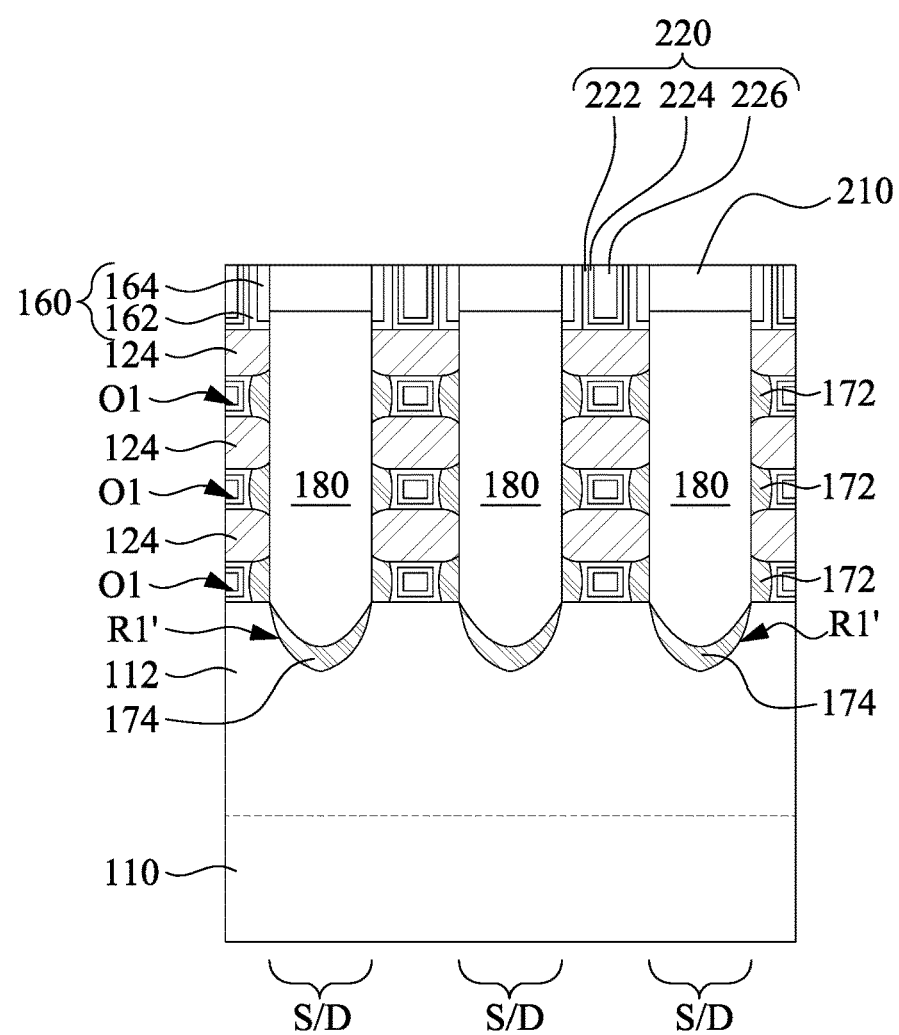
Figure 12B:
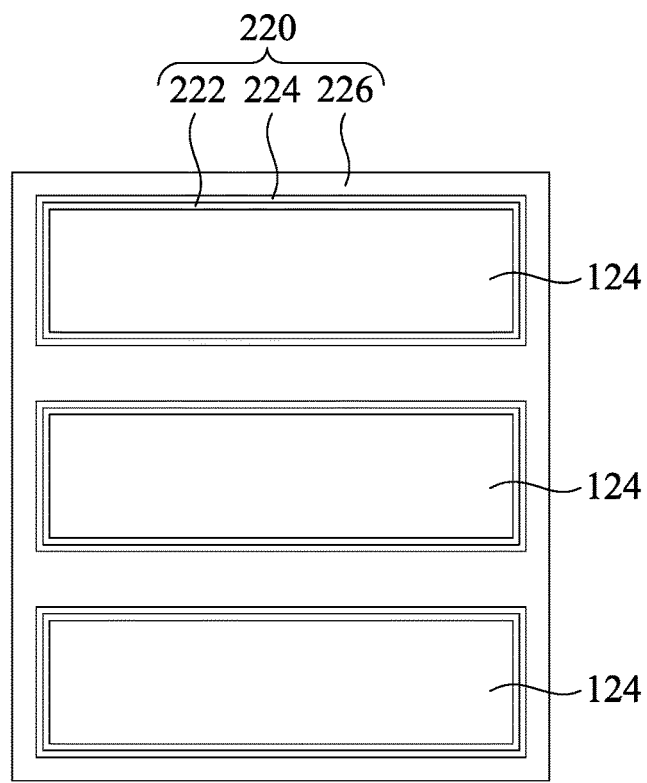

In FIGS. 12A and 12B, replacement gate structures 220 are respectively formed in the gate trenches GT1 to surround each of the epitaxial layers 124 suspended in the gate trenches GT1. The gate structure 220 may be the final gate of a GAA FET. The final gate structure may be a high-k/metal gate stack, however other compositions are possible. In some embodiments, each of the gate structures 220 forms the gate associated with the multi-channels provided by the plurality of epitaxial layers 124. For example, high-k/metal gate structures 220 are formed within the openings O1 (as illustrated in FIG. 12A) provided by the release of epitaxial layers 124. In various embodiments, the high-k/metal gate structure 220 includes a gate dielectric layer 222 formed around the epitaxial layers 124, a work function metal layer 224 formed around the gate dielectric layer 222, and a fill metal 226 formed around the work function metal layer 224 and filling a remainder of gate trenches GT1. The gate dielectric layer 222 includes an interfacial layer (e.g., silicon oxide layer) and a high-k gate dielectric layer over the interfacial layer. High-k gate dielectrics include dielectric materials having a high dielectric constant, for example, greater than that of thermal silicon oxide (~3.9). The work function metal layer 224 and/or fill metal layer 226 used within high-k/metal gate structures 220 may include a metal, metal alloy, or metal silicide. Formation of the high-k/metal gate structures 220 may include depositions to form various gate materials, one or more liner layers, and one or more CMP processes to remove excessive gate materials. As illustrated in a cross-sectional view of FIG. 12B that is taken along a longitudinal axis of a high-k/metal gate structure 220, the high-k/metal gate structure 220 surrounds each of the epitaxial layers 124, and thus is referred to as a gate of a GAA FET.

In some embodiments, the interfacial layer of the gate dielectric layer 222 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 222 may include hafnium oxide ($HfO_2$). Alternatively, the gate dielectric layer 222 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), silicon oxynitrides (SiON), and combinations thereof.

The work function metal layer 224 may include work function metals to provide a suitable work function for the high-k/metal gate structures 220. For an n-type FinFET, the work function metal layer 224 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 134 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 226 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 13:
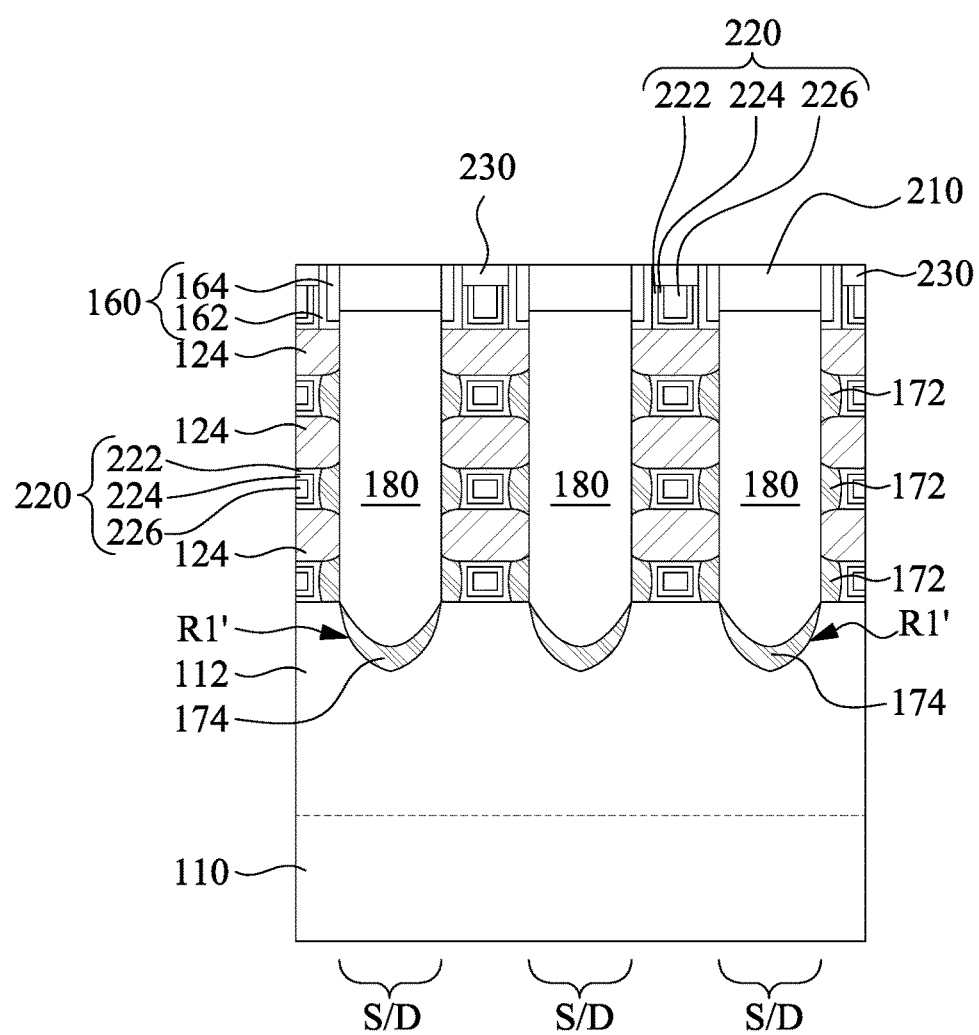

In FIG. 13, optionally, an etching back process is performed to etch back the replacement gate structures 220, resulting in recesses over the etched-back gate structures 220. In some embodiments, because the materials of the replacement gate structures 220 have a different etch selectivity than the gate spacers 160, the top surfaces of the replacement gate structures 220 may be at a lower level than the top surfaces of the gate spacers 160.

Dielectric caps 230 are optionally formed over the etched-back gate structures 220. The dielectric cap layer 230 includes $SiN_x$, $Al_xO_y$, AlON, $SiO_xC_y$, $SiC_xN_y$, combinations thereof or the like, and is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the cap layer outside the recesses, leaving portions of the dielectric cap layer in the recesses to serve as dielectric caps 230.

Figure 14:
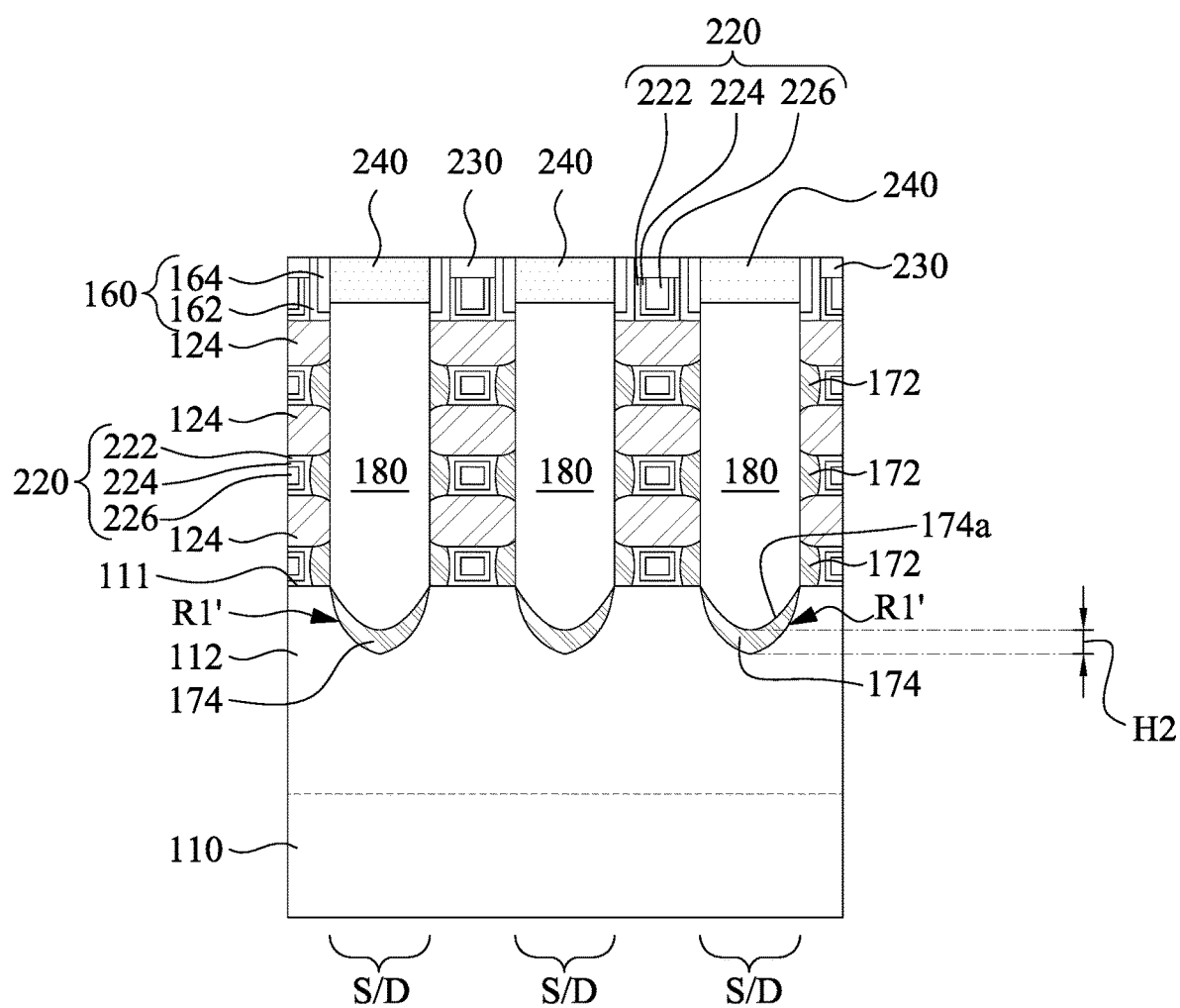

In FIG. 14, source/drain contacts 240 are formed extending through the ILD layer 210 (and the CESL layer, if present). Formation of the source/drain contacts 240 includes, by way of example and not limitation, performing one or more etching processes to form contact openings extending though the ILD layer 210 to expose the source/drain epitaxy structures 180, depositing one or more metal materials overfilling the contact openings, and then performing a CMP process to remove excessive metal materials outside the contact openings. In some embodiments, the one or more etching processes are selective etching that etches the ILD layer 210 at a faster etch rate than etching the dielectric caps 230 and the gate spacers 160. As a result, the selective etching is performed using the dielectric caps 230 and the gate spacers 160 as an etch mask, such that the contact openings and hence the source/drain contacts 240 are formed self-aligned to the source/drain epitaxy structures 180 without using an additional photolithography process. In that case, the dielectric caps 230 allowing for forming the self-aligned contacts 240 can be called SAC caps 230.

The integrated circuit structure 100 includes the substrate 110, the channel layers 124 arranged one above another in a spaced apart manner over the substrate 110, the gate structure 220 surrounding/wrapping each of the channel layers 124, the source/drain epitaxial structures 180 connected to the channel layers 124, and the bottom dielectric structures 174 between the source/drain epitaxial structures 180 and the substrate 110. That is, the source/drain epitaxial structures 180 are separated from the substrate 110 by the bottom dielectric structures 174. The bottom dielectric structures 174 are respectively below the source/drain epitaxial structures 180 to prevent the current of the source/drain epitaxial structures 180 from leaking into the substrate 110 and then to the other source/drain epitaxial structures 180.

In some embodiments, the bottom dielectric structure 174 is embedded in the substrate 110 and is conformal to the inner surface of the recess R1' of the substrate 110. That is, the bottom dielectric structure 174 has a curved (convex) bottom surface and a curved (concave) top surface. The top surface 174a of the bottom dielectric structure 174 is lower than the top surface 111 of the substrate 110. A maximum thickness H2 of the bottom dielectric structure 174 is in a range from about 1 nm to about 500 nm. If the thickness H2 is greater than about 500 nm, the source/drain epitaxial structures 180 may be not easy to be deposited on the bottom dielectric structures 174; if the thickness H2 is less than about 1 nm, the source/drain epitaxial structures 180 may have current leakage problems.

In some embodiments, the integrated circuit structure 100 further includes the inner dielectric spacers 172 between the gate structure 220 and the source/drain epitaxial structures 180. As described in FIGS. 7-8, since the inner dielectric spacers 172 and the bottom dielectric structures 174 are formed in the same process, the inner dielectric spacers 172 and the bottom dielectric structures 174 have the same materials.

Figure 15:
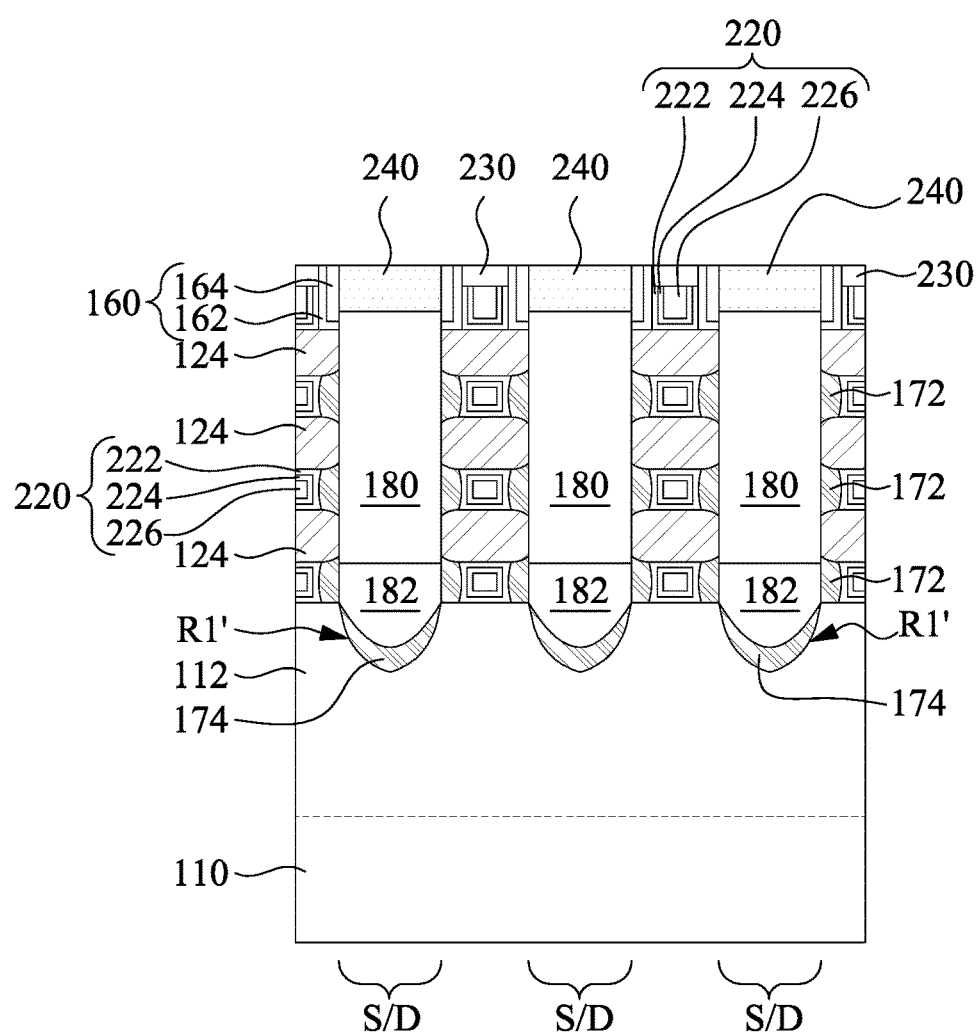
FIG. 15 is a cross-sectional view of an integrated circuit structure in accordance with some embodiments of the present disclosure.

FIG. 15 is a cross-sectional view of an integrated circuit structure (or a semiconductor device) 100a in accordance with some embodiments of the present disclosure. The difference between the integrated circuit structure 100a in FIG. 15 and the integrated circuit structure 100 in FIG. 14 pertains to the shape of the source/drain epitaxial structures 180. In FIG. 15, at least one void (or air gap) 182 is formed between the source/drain epitaxial structure 180 and the bottom dielectric structure 174. The void 182 may be formed in the epitaxial growth process described in FIG. 9A. The epitaxial growth process may be a selectively epitaxial growth (SEG) process, which has a higher growth rate over a semiconductive material (e.g., the channel layers 124) than over a dielectric material (e.g., the bottom dielectric structures 174 and the inner dielectric spacers 172). As such, at least a portion of the source/drain epitaxial structures 180 may be suspended over the bottom dielectric structures 174 and form voids under the source/drain epitaxial structures 180. In some embodiments, the shape of the source/drain epitaxial structures 180 can be adjusted by tuning recipes of the epitaxial growth process. Other relevant structural and manufacturing details of the integrated circuit structure 100a are substantially the same or similar to the integrated circuit structure 100 of FIG. 14, and, therefore, a description in this regard will not be repeated hereinafter.

Figure 16:
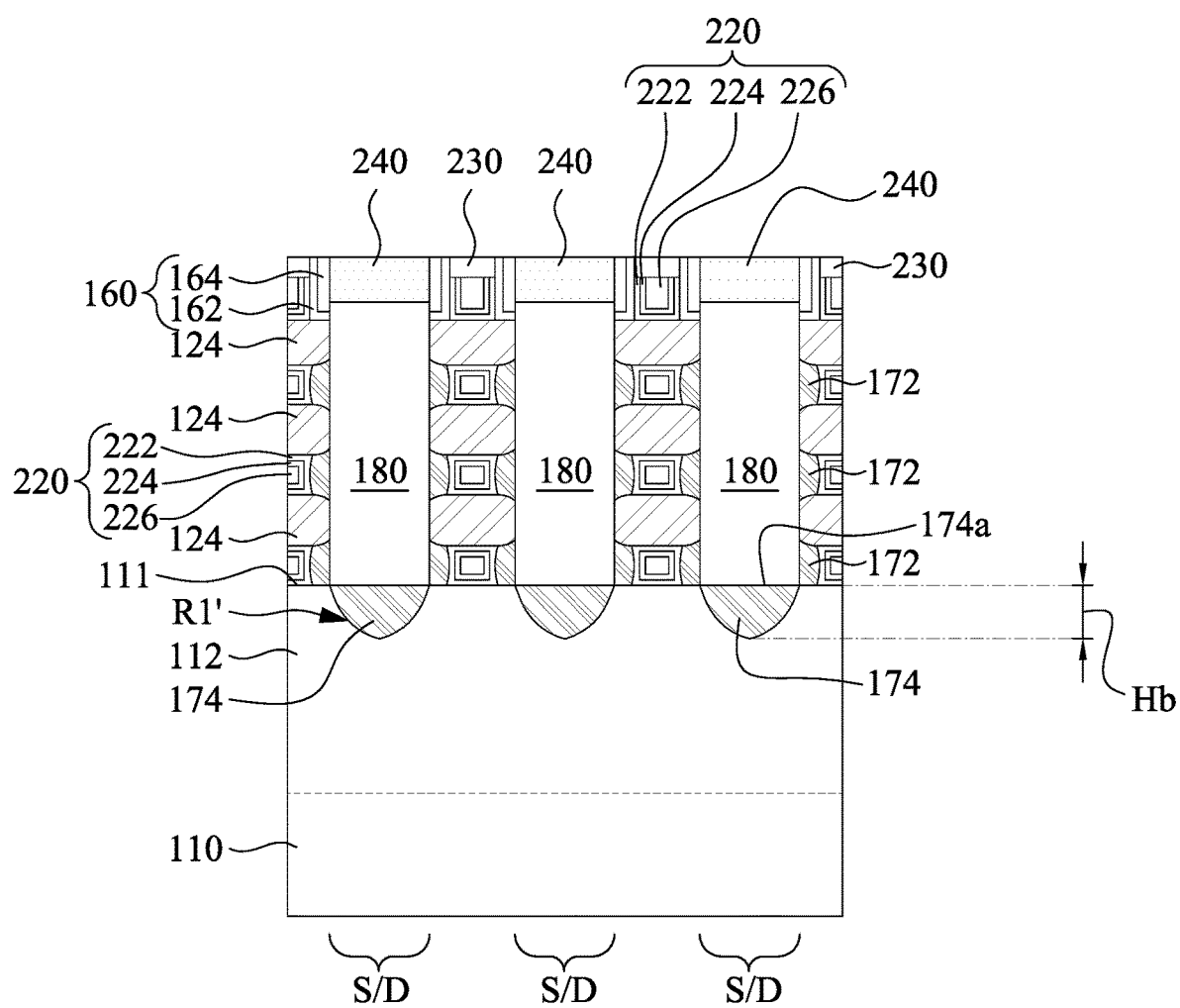
FIGS. 16 and 17 are cross-sectional view of integrated circuit structures in accordance with some embodiments of the present disclosure.
Figure 17:
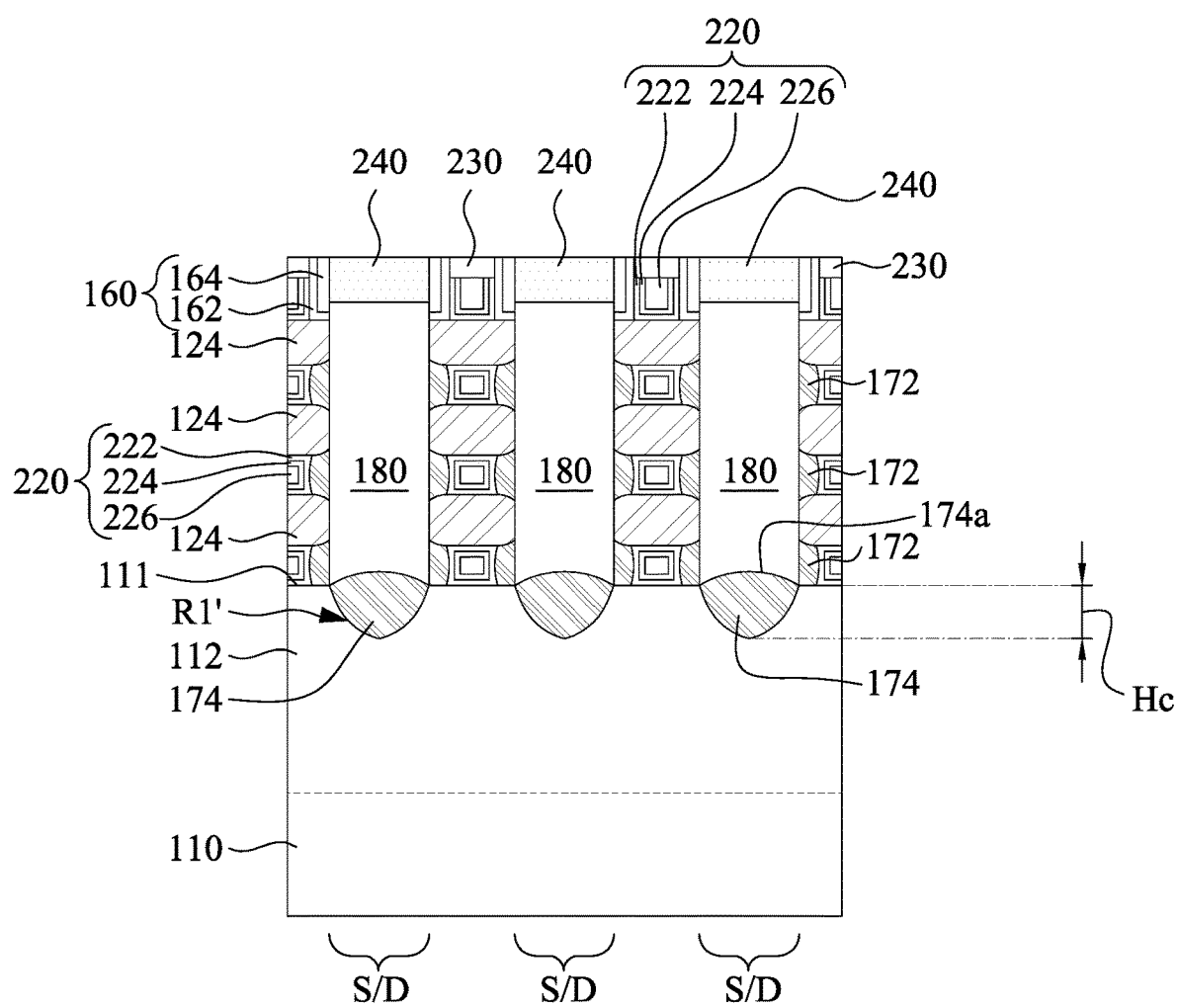

FIGS. 16 and 17 are cross-sectional view of integrated circuit structures (or semiconductor devices) 100b and 100c in accordance with some embodiments of the present disclosure. The difference among the integrated circuit structure 100b in FIG. 16, the integrated circuit structure 100c in FIG. 17, and the integrated circuit structure 100 in FIG. 14 pertains to the shape of the bottom dielectric structures 174. In FIG. 16, the bottom dielectric structure 174 has a substantially planar top surface, and in FIG. 17, the bottom dielectric structure 174 has a convex top surface. That is, the top surface 174a of the bottom dielectric structure 174 is substantially level with the top surface 111 of the substrate 110 in FIG. 16, and the top surface 174a of the bottom dielectric structure 174 is higher than the top surface 111 of the substrate 110 in FIG. 17. In some embodiments, the shape of the bottom dielectric structures 174 is adjusted by tuning the depth of the recesses R1'. For example, the depths Hb and Hc of the recesses R1' in FIGS. 16 and 17 are shallower than the depth H1 of the recesses R1' in FIG. 5B. Therefore, the spacer material layers 170' (see FIG. 7) are easier to fill the recesses R1' in FIGS. 16 and 17. As such, after the anisotropic etching process ET1 shown in FIG. 8, more spacer material layers 170' are left in the recesses R1' of FIGS. 16 and 17. Alternatively or additionally, more fluorine can be added in the plasma for etching the spacer material layer 170' to form the bottom dielectric structures 174 shown in FIGS. 16 and 17. Other relevant structural and manufacturing details of the integrated circuit structures 100b and 100c are substantially the same or similar to the integrated circuit structure 100 of FIG. 14, and, therefore, a description in this regard will not be repeated hereinafter.

Figure 18:
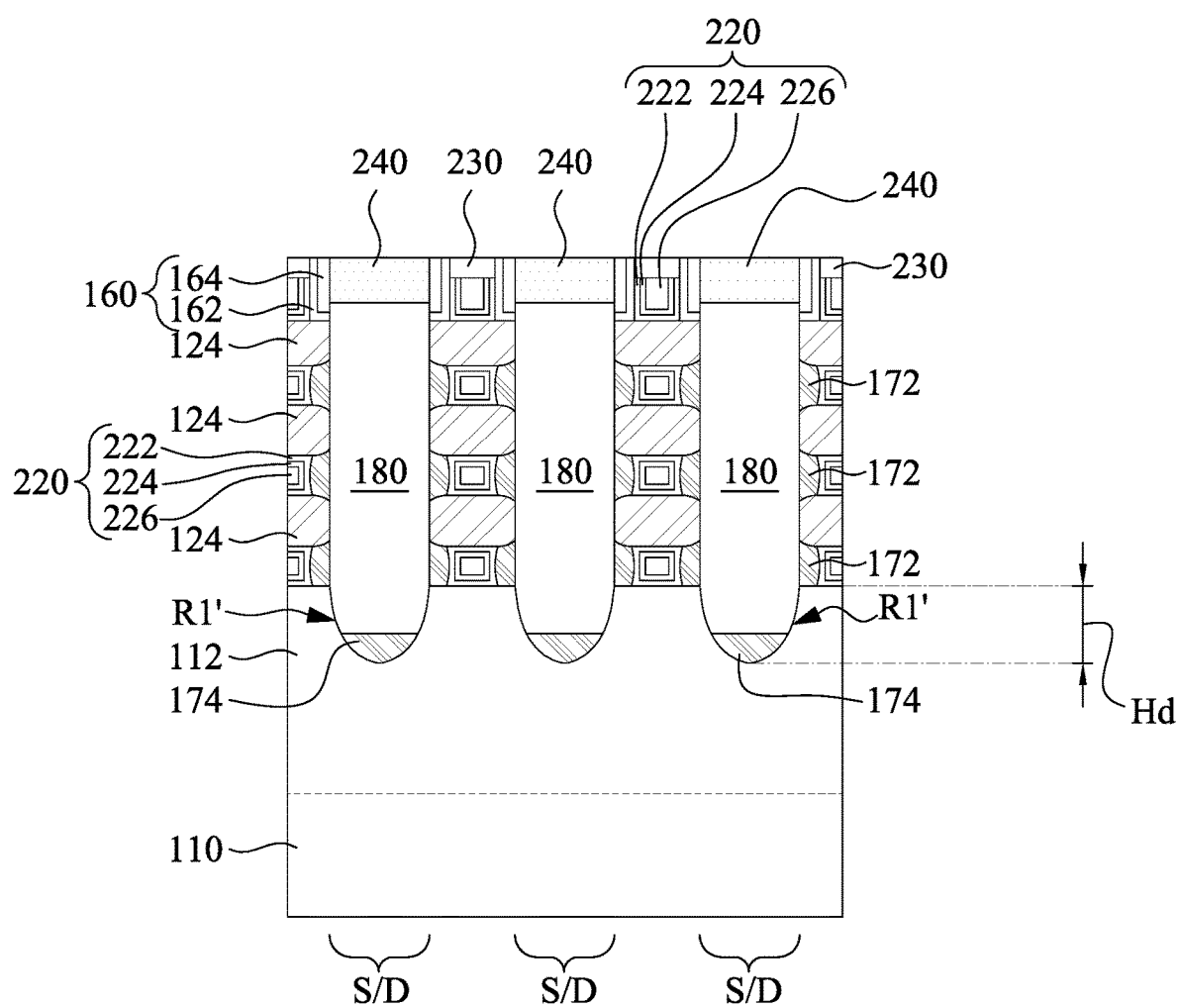
FIG. 18 is a cross-sectional view of an integrated circuit structure in accordance with some embodiments of the present disclosure.

FIG. 18 is a cross-sectional view of an integrated circuit structure (or a semiconductor device) 100d in accordance with some embodiments of the present disclosure. The difference among the integrated circuit structure 100d in FIG. 18 and the integrated circuit structure 100 in FIG. 14 pertains to the shape of the bottom dielectric structures 174. In FIG. 18, the bottom dielectric structures 174 are formed in the bottom of the recesses R1' and expose portions of the inner surfaces of the recesses R1'. In some embodiments, the shape of the bottom dielectric structures 174 is adjusted by tuning the depth of the recess R1'. For example, the depth Hd of the recesses R1' in FIG. 18 is deeper than the depth H1 of the recesses R1' in FIG. 5B. Therefore, the spacer material layers 170' (see FIG. 7) may be formed at the bottom of the recesses R1' in FIG. 18. As such, after the anisotropic etching process ET1 shown in FIG. 8, less spacer material layers 170' are left in the recesses R1' of FIG. 18. Alternatively or additionally, less fluorine are added in the plasma for etching the spacer material layer 170' to form the bottom dielectric structures 174 shown in FIG. 18. With such configuration, the source/drain epitaxy structures 180 may fill the rest of the recesses R1'. That is, the source/drain epitaxy structures 180 are in contact with the substrate 110; be that as it may, the bottom dielectric structures 174 in FIG. 18 also improve the current leakage problem of the source/drain epitaxy structures 180. Other relevant structural and manufacturing details of the integrated circuit structure 100d are substantially the same or similar to the integrated circuit structure 100 of FIG. 14, and, therefore, a description in this regard will not be repeated hereinafter.

In some embodiments, the inner dielectric spacers 172 and the bottom dielectric structure 174 may include different materials. As such, the inner dielectric spacers 172 and the bottom dielectric structure 174 are formed in different processes. FIGS. 19-22 illustrate exemplary cross sectional views of various stages for manufacturing an integrated circuit structure (or a semiconductor device) 100e according to some other embodiments of the present disclosure. It is understood that additional operations can be provided before, during, and after processes shown by FIGS. 19-22, and some of the operations described below can be replaced or eliminated, for additional embodiments of the method. The order of the operations/processes may be interchangeable. The same or similar configurations, materials, processes and/or operation as described with FIGS. 1-14 may be employed in the following embodiments, and the detailed explanation may be omitted.

Figure 19:
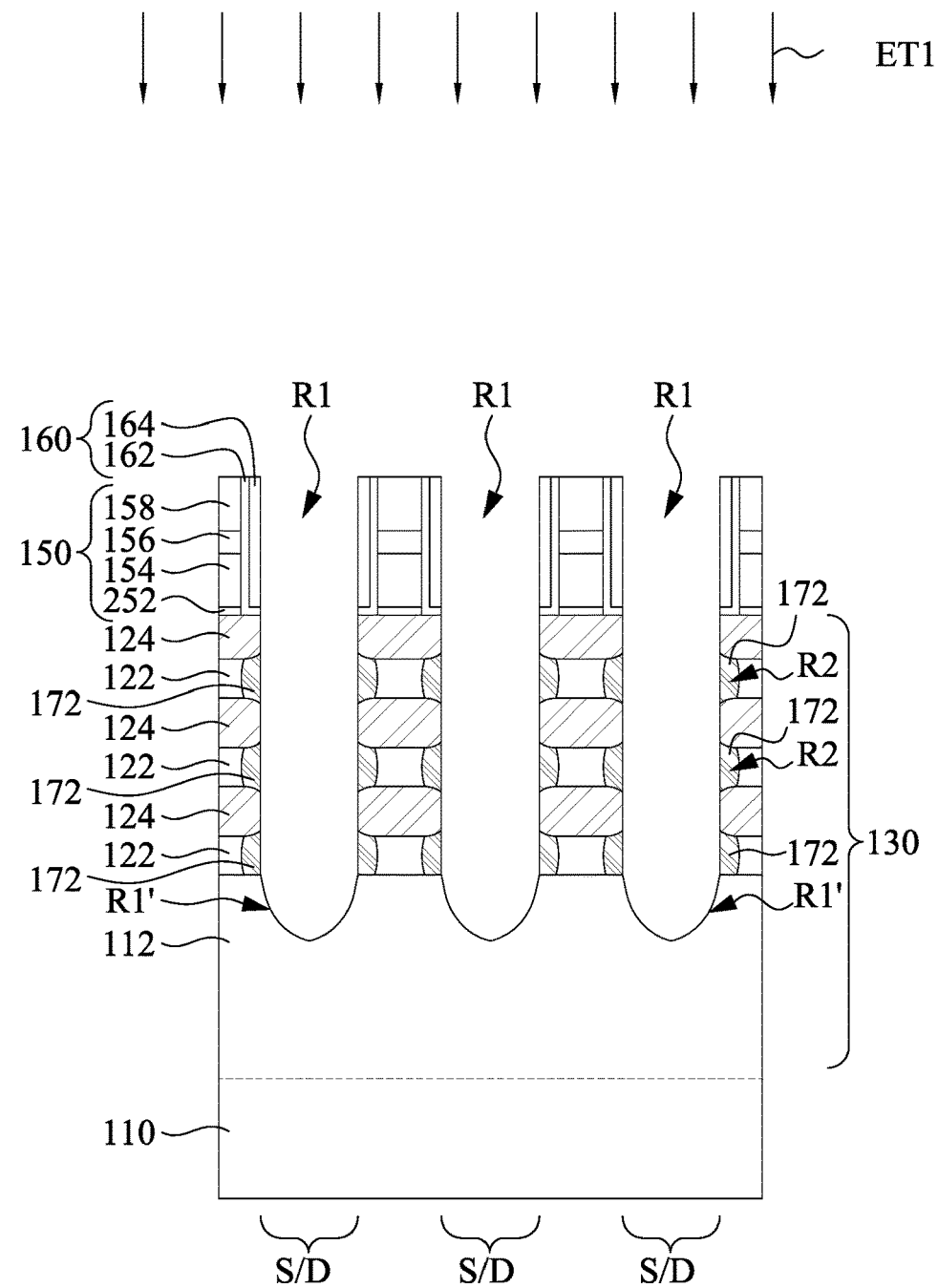
FIGS. 19-22 illustrate exemplary cross sectional views of various stages for manufacturing an integrated circuit structure according to some other embodiments of the present disclosure.

After the structure as shown in FIG. 7 is formed, an anisotropic etching process ET1' is performed to trim the deposited spacer material layer 170' as shown in FIG. 19, such that portions of the deposited spacer material layer 170' that fill the recesses R2 left by the lateral etching of the epitaxial layers 122 are left, and another portion of the deposited spacer material layer 170' that deposited in the bottom of the recesses R1' left by the etching of the fin structures 130 are removed. After the trimming process, the remaining portions of the deposited spacer material are denoted as inner dielectric spacers 172 in the recesses R2, for the sake of simplicity. During this anisotropic etching process ET1', less fluorine is used in the plasma etching process, such that the portion of the spacer material layer 170' in the recesses R1' can be removed.

Figure 20:
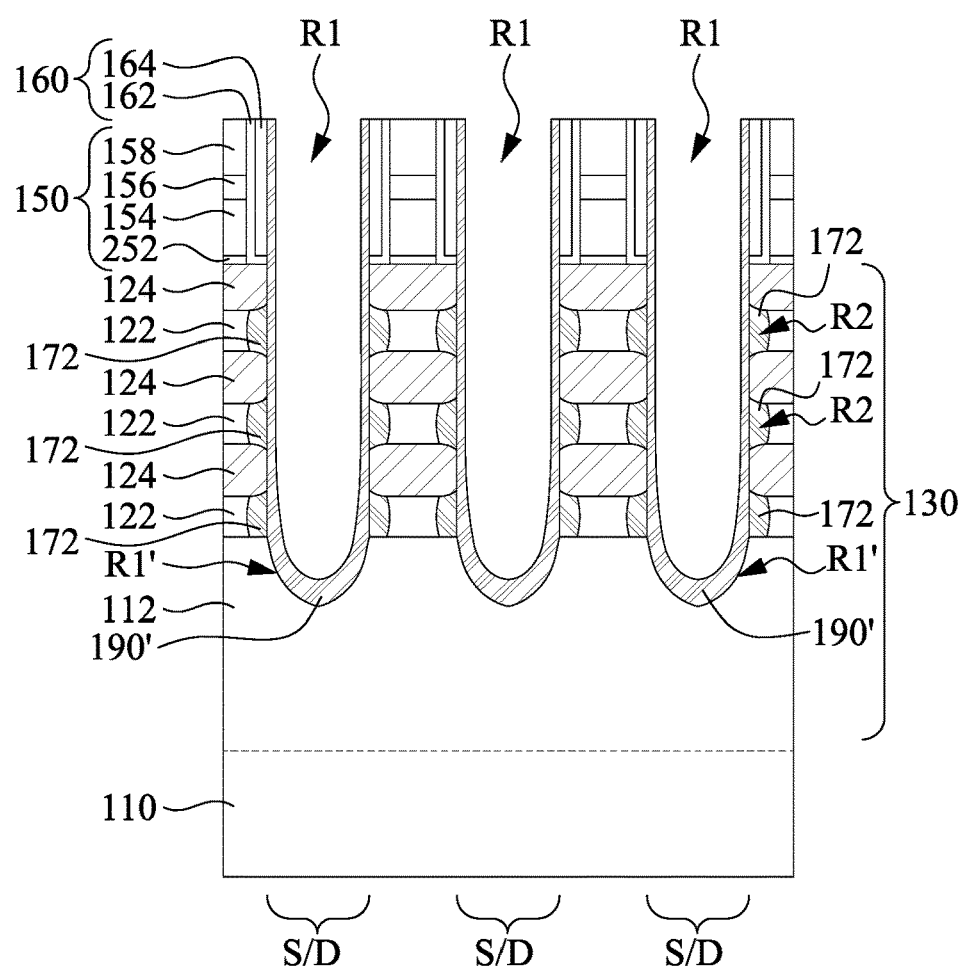

In FIG. 20, spacer material layers 190' are formed to fill the recesses R1'. The spacer material layers 190' may be a low-k dielectric material, such as $SiO_2$, SiN, SiC, SiON, SiCN, or SiOCN, and may be formed by a suitable deposition method, such as ALD. The spacer material layers 190' can be formed using CVD, including LPCVD and PECVD, PVD, ALD, or other suitable processes. The spacer material layers 190' and the spacer material layer 170' are made of different materials.

Figure 21:
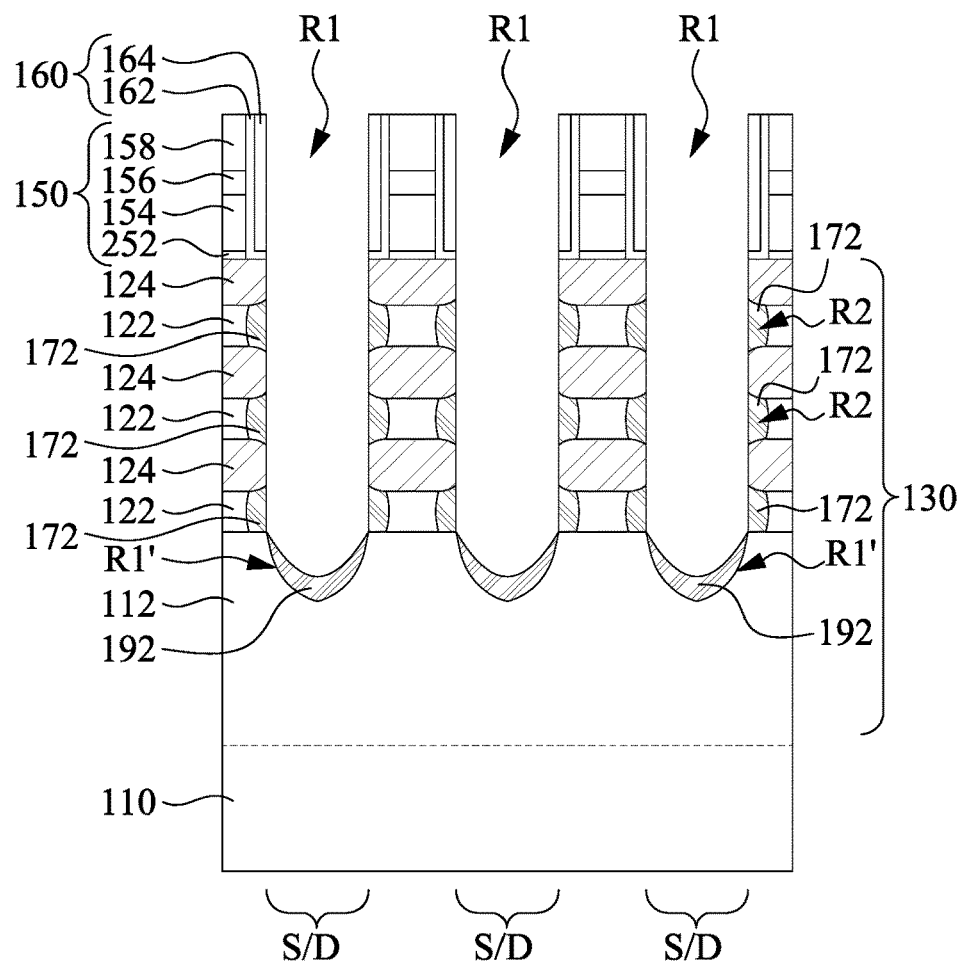

Referring to FIG. 21, after the deposition of the spacer material layers 190', another anisotropic etching process ET2 may be performed to trim the deposited spacer material layers 190', such that portions of the deposited spacer material layers 190' that deposited in the bottom of the recesses R1' left by the etching of the fin structures 130 are left. After the trimming process, the remaining portions of the deposited spacer material are denoted as bottom dielectric structures 192 in the recesses R1', for the sake of simplicity.

In some embodiments, the anisotropic etching process ET2 is a plasma etching. The substrate 110 having the structure illustrated in FIG. 20 can be loaded into a plasma tool and exposed to a plasma environment generated by RF or microwave power in a gaseous mixture of a fluorine containing gas, such as $CHF_3$, $CF_4$, $C_4F_8$, $C_5F_8$, $C_4F_6$, or similar species, an inert gas, such as argon or helium, for a duration time sufficient to etch portions of the spacer material layers 190' outside the recesses R1'. A plasma generated in a gaseous mixture including $CHF_3$, $CF_4$ and argon can be used to tune the shape of the bottom dielectric structures 192. With more fluorine, the lateral etching rate of the plasma etching is increased, and more amount of the bottom dielectric structures 192 remains. The plasma is generated by RF power with a bias greater than 0 and equal to or less than about 30 V. If the bias is greater than about 30V, the bottom dielectric structures 192 may be completely removed; if the bias is absent, the inner dielectric spacers 172 may be etched.

Figure 22:
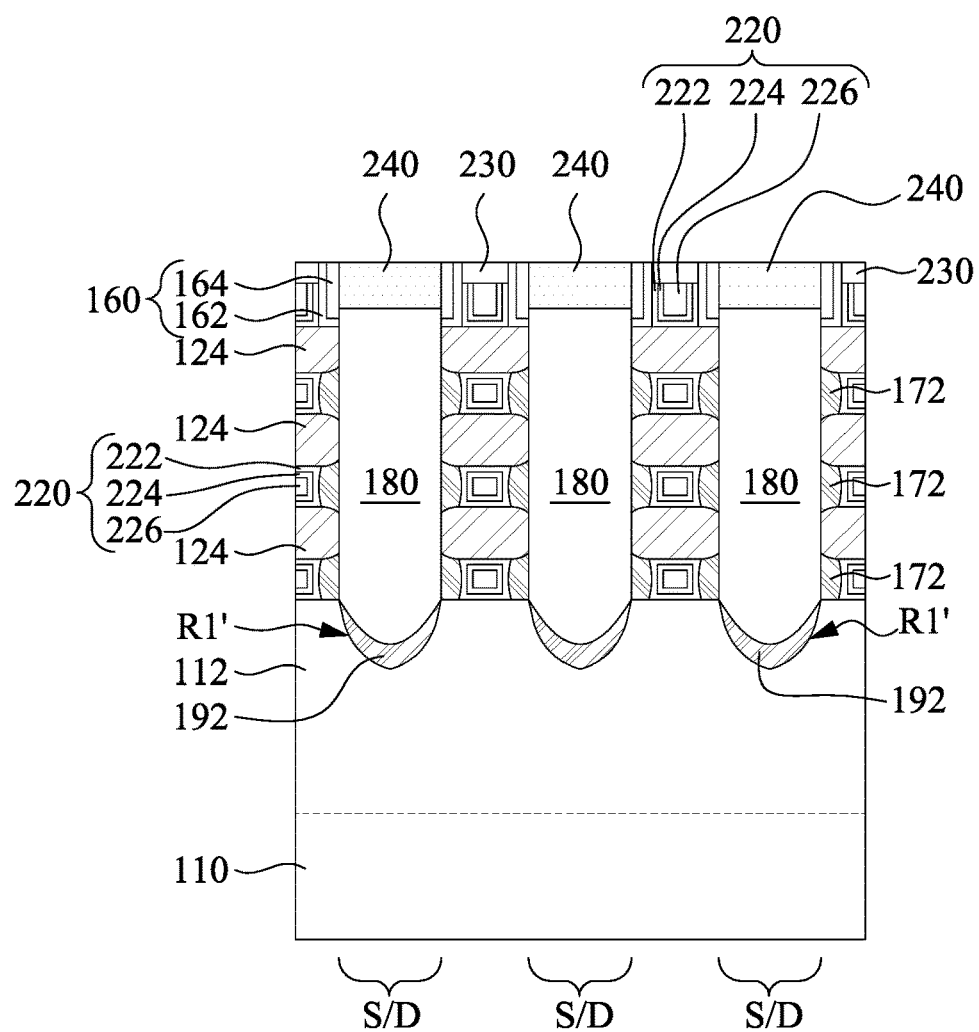

Referring to FIG. 22, after the etching process ET2 in FIG. 21 is complete, the structure of FIG. 21 undergoes the processes similar to FIGS. 9A-14. That is, the source/drain epitaxial structures 180 are formed over the source/drain regions S/D of the semiconductor fins 130 and the bottom dielectric structures 192. The ILD layer 210 is formed on the substrate 110. The dummy gate structures 150 are replaced with the gate structures 220. The dielectric caps 230 are optionally formed over the etched-back gate structures 220. The source/drain contacts 240 are formed extending through the ILD layer 210 (and the CESL layer, if present). Materials and fabrication process details about the aforementioned processes/elements are similar to that shown in FIGS. 9A-14, and thus they are not repeated herein for the sake of brevity.

As mentioned above, the bottom dielectric structures 192 may be made of a material different from that of the inner dielectric spacers 172. In some embodiments, the inner dielectric spacers 172 and the bottom dielectric structures 192 have etching selectivity, such that the anisotropic etching process ET2 in FIG. 21 does not damage the inner dielectric spacers 172. Alternatively or additionally, the inner dielectric spacers 172 include high-k dielectric materials, and the bottom dielectric structures 192 include low-k dielectric materials. For example, the inner dielectric spacers 172 include SiNCO, SiN, combinations, or the like, and the bottom dielectric structures 192 include SiO, SiC, combinations, or the like. Since the bottom dielectric structures 192 are low-k dielectric materials, the parasitic capacitance of the integrated circuit structure 100e can be reduced. Other relevant structural and manufacturing details of the integrated circuit structure 100e are substantially the same or similar to the integrated circuit structure 100 of FIG. 14, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the bottom dielectric structures improve the current leakage problems between the source/drain epitaxial structures through the substrate, thereby also improves the drain induced barrier lowering (DIBL) problem of the integrated circuit structure. Another advantage is that the material of the bottom dielectric structure can be chosen to lower the parasitic capacitance of the integrated circuit structure.

According to some embodiments, a device includes a substrate, a channel layer, a gate structure, a source/drain epitaxial structure, and a bottom dielectric structure. The channel layer is over the substrate. The gate structure is over the substrate and surrounds the channel layer. The source/drain epitaxial structure is over the substrate and is connected to the channel layer. The bottom dielectric structure is between the source/drain epitaxial structure and the substrate.

According to some embodiments, a device includes a plurality of channel layers, a gate structure, a source/drain epitaxial structure, an inner dielectric spacer, and a bottom dielectric structure. The channel layers are arranged one above another in a spaced apart manner over a substrate. The gate structure surrounds each of the plurality of channel layers. The source/drain epitaxial structure is connected to the channel layers. The inner dielectric spacer is between the source/drain epitaxial structure and the gate structure. The bottom dielectric structure is below the source/drain epitaxial structure.

According to some embodiments, a method includes forming a fin structure comprising a plurality of first semiconductor layers and a plurality of second semiconductor layers alternately stacked over a substrate. A dummy gate structure is formed across the fin structure such that the dummy gate structure covers a first portion of the fin structure while second portions of the fin structure are exposed. The exposed second portions of the fin structure are removed. A portion of the substrate under the exposed second portions of the fin structure is removed to form a recess in the substrate. A bottom dielectric structure is formed in the recess of the substrate. After forming the bottom dielectric structure, a source/drain epitaxial structure is formed on opposite end surfaces of the second semiconductor layers in the first portion of the fin structure. The dummy gate structure is removed to expose the first portion of the fin structure. The first semiconductor layers in the exposed first portion of the fin structure is removed while leaving the second semiconductor layers in the exposed first portion of the fin structure suspended above the substrate. A gate structure is formed to surround each of the suspended second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   a channel layer over the substrate;
   a gate structure across the channel layer;
   a first source/drain epitaxial structure and a second source/drain epitaxial structure on opposite sides of the channel layer and connected to the channel layer; and
   a bottom dielectric structure between the first source/drain epitaxial structure and the substrate, wherein a maximum width of the first source/drain epitaxial structure is greater than or equal to a maximum width of the bottom dielectric structure in a cross-sectional view, and the bottom dielectric structure is in contact with the substrate.

2. The device of claim 1, wherein a void exists between the first source/drain epitaxial structure and the bottom dielectric structure.

3. The device of claim 1, further comprising an inner spacer between the gate structure and the first source/drain epitaxial structure.

4. The device of claim 3, wherein the bottom dielectric structure is spaced apart from the inner spacer.

5. The device of claim 3, wherein the bottom dielectric structure and the inner spacer are made of the same material.

6. The device of claim 1, wherein the first source/drain epitaxial structure is in contact with the substrate.

7. The device of claim 1, wherein an interface between the bottom dielectric structure and the first source/drain epitaxial structure is lower than a top surface of the substrate.

8. A method comprising:
   forming a semiconductive layer over a substrate;
   forming a dummy gate over the semiconductive layer to define a channel portion in the semiconductive layer and under the dummy gate and source/drain portions in the semiconductive layer and on opposite sides of the channel portion;
   removing the source/drain portions of the semiconductive layer;
   after removing the source/drain portions of the semiconductive layer, forming a recess in the substrate;
   depositing a dielectric layer in the recess and in contact with end surfaces of the channel portion of the semiconductive layer;
   etching the dielectric layer to form a bottom dielectric structure in the recess;
   epitaxially growing a first source/drain epitaxial structure and a second source/drain epitaxial structure on opposite sides of the channel portion of the semiconductive layer, wherein the first source/drain epitaxial structure is over the bottom dielectric structure; and
   replacing the dummy gate with a gate structure.

9. The method of claim 8, wherein forming the recess in the substrate comprises etching the substrate to form the recess.

10. The method of claim 9, wherein etching the substrate is performed by using a gaseous mixture of HBr and He.

11. The method of claim 8, wherein etching the dielectric layer is performed by using a plasma etching process.

12. The method of claim 11, wherein the plasma etching process is generated in a gaseous mixture comprising $CHF_3$, $CF_4$ and argon.

13. The method of claim 8, wherein the dielectric layer deposited in the recess is in contact with the substrate.

14. A method comprising:
   providing a workpiece comprising:
      a substrate;
      a fin structure over the substrate and comprising a plurality of first semiconductive layers interposed by a plurality of second semiconductive layers; and
      a dummy gate covering the fin structure, wherein the fin structure has a channel region directly under the dummy gate and source/drain regions on opposite sides of the channel region;
   performing a first etching process to remove the source/drain regions of the fin structure and forming a first recess in the substrate;
   performing a second etching process to form second recesses on opposite ends of the second semiconductive layers;
   depositing a dielectric layer in the first recess and the second recesses;
   performing a third etching process to the dielectric layer to form a bottom dielectric structure in the first recess and inner spacers in the second recesses, respectively, wherein end surfaces of the first semiconductive layers are exposed after performing the third etching process to the dielectric layer to form the bottom dielectric structure in the first recess and the inner spacers in the second recesses;
   forming source/drain epitaxial structures on opposite sides of the first semiconductive layers; and
   replacing the dummy gate and the second semiconductive layers with a gate structure.

15. The method of claim 14, wherein performing the first etching process is performed by using an etching gas comprising fluorine-based gas, chloride-based gas, hydrogen bromide gas (HBr), oxygen gas (02), or combinations thereof.

16. The method of claim 14, wherein performing the third etching process is performed with a plasma etching process, and a plasma of the plasma etching process is generated from a gaseous mixture comprising $CHF_3$, $CF_4$, and argon.

17. The method of claim 14, wherein performing the third etching process is performed with a plasma etching process, and the plasma etching process is performed under an RF power with a bias greater than 0 and equal to or less than about 30 V.

18. The method of claim 14, wherein the first recess has an aspect ratio in a range from about 1.3 to about 15.

19. The method of claim 14, wherein the dielectric layer is made of $SiO_2$, SiN, SiC, SiON, SiCN, or SiOCN.

20. The method of claim 14, wherein a topmost surface of the bottom dielectric structure is lower than a topmost surface of the substrate.

* * * * *